(12) United States Patent
Choi et al.

(10) Patent No.: US 10,919,211 B2
(45) Date of Patent: Feb. 16, 2021

(54) METHOD OF MANUFACTURING DISPLAY DEVICE

(71) Applicant: Samsung Display Co., Ltd., Yongin-si (KR)

(72) Inventors: Myung Gil Choi, Yongin-si (KR); Jung Min Lee, Suwon-si (KR); Sang Moo Lee, Anyang-si (KR); Sae Sam Jang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 455 days.

(21) Appl. No.: 15/649,124

(22) Filed: Jul. 13, 2017

(65) Prior Publication Data

US 2018/0022013 A1 Jan. 25, 2018

(30) Foreign Application Priority Data

Jul. 22, 2016 (KR) .................. 10-2016-0093160
Jul. 27, 2016 (KR) .................. 10-2016-0095318

(51) Int. Cl.

| | |
|---|---|
| *B29C 53/36* | (2006.01) |
| *B32B 37/12* | (2006.01) |
| *H05K 1/02* | (2006.01) |
| *B29L 31/34* | (2006.01) |
| *H05K 1/18* | (2006.01) |
| *H05K 3/32* | (2006.01) |

(Continued)

(52) U.S. Cl.
CPC .............. *B29C 53/36* (2013.01); *B32B 37/12* (2013.01); *B32B 37/14* (2013.01); *H05K 1/028* (2013.01); *H05K 3/323* (2013.01); *B29L 2031/3425* (2013.01); *B29L 2031/3437* (2013.01); *B29L 2031/3475* (2013.01); *B32B 37/18* (2013.01); *B32B 38/1866* (2013.01); *B32B 2457/08* (2013.01); *H05K 1/189* (2013.01); *H05K 2201/055* (2013.01); *H05K 2201/056* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 9,748,505 B2 | 8/2017 | Suzuki et al. | |
| 2011/0099804 A1* | 5/2011 | Hamada | H05K 3/361 29/832 |

(Continued)

FOREIGN PATENT DOCUMENTS

| | | |
|---|---|---|
| CN | 104952373 A | 9/2015 |
| CN | 105975117 A | 9/2016 |

(Continued)

OTHER PUBLICATIONS

Chinese Patent Office Action for corresponding Chinese Patent Application No. 201710604908.7, dated Sep. 2, 2020, 11 pages.

*Primary Examiner* — Barbara J Musser
(74) *Attorney, Agent, or Firm* — Lewis Roca Rothgerber Christie LLP

(57) ABSTRACT

A method of manufacturing a display device includes bending a first film member of a processing object such that a part of one side of the first film member surrounds a part of an outer side of a bending area of a second film member of the processing object while the first film member is laminated on the second film member.

20 Claims, 32 Drawing Sheets

(51) Int. Cl.
*B32B 37/14* (2006.01)
*B32B 37/18* (2006.01)
*B32B 38/18* (2006.01)

(56) References Cited

U.S. PATENT DOCUMENTS

| | | | |
|---|---|---|---|
| 2014/0307396 A1* | 10/2014 | Lee | G02F 1/133305 |
| | | | 361/749 |
| 2016/0117041 A1 | 4/2016 | Lee et al. | |
| 2016/0122600 A1 | 5/2016 | Moon et al. | |
| 2016/0268524 A1* | 9/2016 | Suzuki | H01L 51/0097 |

FOREIGN PATENT DOCUMENTS

| | | |
|---|---|---|
| KR | 10-2011-0036788 A | 4/2011 |
| KR | 10-2015-0059048 A | 5/2015 |
| KR | 10-2015-0079285 A | 7/2015 |

\* cited by examiner

METHOD OF MANUFACTURING DISPLAY DEVICE

CROSS-REFERENCE TO RELATED APPLICATIONS

This application claims priority to and the benefit of Korean Patent Application Nos. 10-2016-0093160 and 10-2016-0095318, respectively filed on Jul. 22, 2016 and Jul. 27, 2016 in the Korean Intellectual Property Office, the disclosures of which are incorporated herein by reference in their entirety.

BACKGROUND

1. Field

Aspects of embodiments of the present invention relate to a method of manufacturing a display device and an apparatus for manufacturing a display device.

2. Description of the Related Art

The importance of a display device has increased with the development of multimedia. Various types of display devices, such as liquid crystal displays (LCDs), organic light-emitting diode (OLED) displays, and the like, have been developed in response to the increase in multimedia consumption.

Recently, mobile electronic appliances (e.g., mobile electronic devices) have become popular. In addition to small electronic appliances, such as mobile phones, tablet PCs have been widely used as mobile electronic appliances.

Such mobile electronic appliances generally include a display device for providing a user with visual information, such as image information or video information, in order to support various functions. Recently, as parts or components for driving a display device have been made smaller or miniaturized, the proportion of the display device in an electronic appliance has gradually increased, and a bendable display device that can be bent (e.g., bent to a certain angle) from a flat state has also been developed.

SUMMARY

Embodiments of the present invention provide a method of manufacturing a display device that prevents or reduces the occurrence of breakage of internal parts of a display device.

Embodiments of the present invention also reduce or minimize stress applied to parts of a display device by stably bending some components thereof.

However, the present invention does not provide only the features set forth herein. The above and other aspects and features of the present invention will become more apparent to one of ordinary skill in the art to which the present invention pertains by referencing the detailed description below.

According to an embodiment of the present invention, a method of manufacturing a display device includes bending a first film member of a processing object such that a part of one side of the first film member surrounds a part of an outer side of a bending area of a second film member of the processing object that is laminated on the first film member.

According to another embodiment of the present invention, an apparatus for manufacturing a display device includes: a stage configured to accommodate a processing object, the processing object including a first film member laminated on a second film member, the second film member having a bending area; and a bending head configured to contact the first film member and to bend the first film member such that a part of one side of the first film member surrounds a part of an outer side of the bending area of the second film member.

BRIEF DESCRIPTION OF THE DRAWINGS

The above and other aspects and features of the present invention will become more apparent by describing, in detail, exemplary embodiments thereof with reference to the attached drawings, in which.

DETAILED DESCRIPTION

Figure 1:
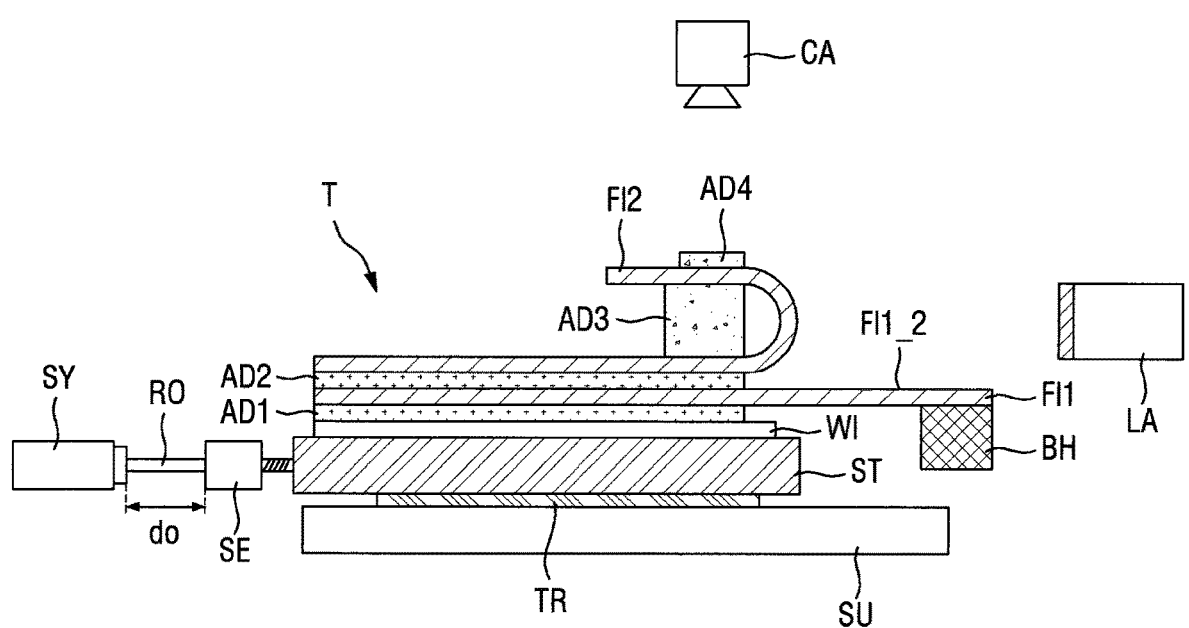
FIG. 1 is a sectional view of an apparatus for manufacturing a display device according to an embodiment of the present invention.

Aspects and features of the present invention and methods providing those aspects and features will be apparent by referring to exemplary embodiments of the present invention to be described, in detail, below with reference to the accompanying drawings. However, the present invention is not limited to the exemplary embodiments disclosed hereinafter and can be implemented in diverse forms. The exemplary embodiments described below, including the detailed construction and elements thereof, are details provided to assist those of ordinary skill in the art to have a comprehensive understanding of the present invention. The present invention is defined by the scope of the appended claims and their equivalents.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, exemplary embodiments of the present invention will be described with reference to the attached drawings.

Figure 2:
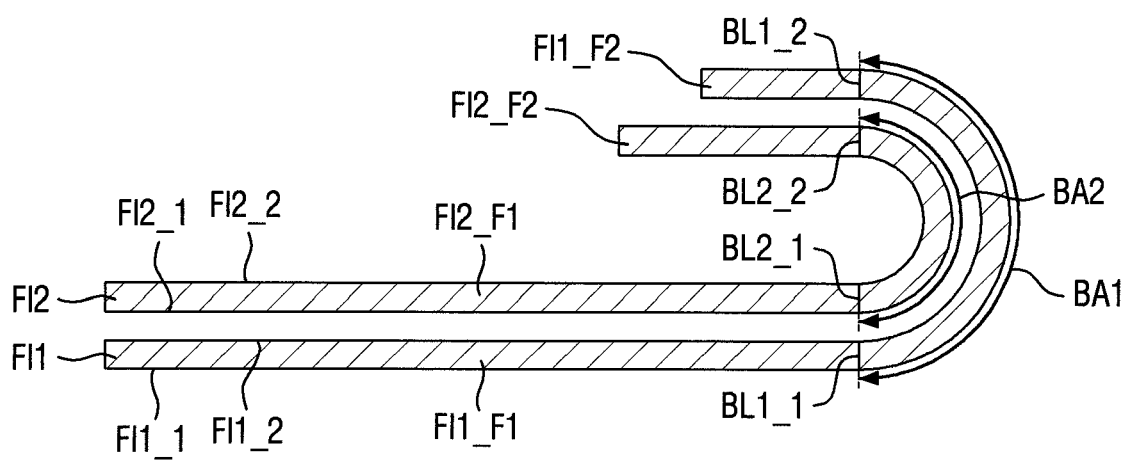
FIG. 2 is a conceptual view for explaining aspects of the apparatus for manufacturing a display device according to the embodiment of FIG. 1.

FIG. 1 is a sectional view of an apparatus for manufacturing a display device according to an embodiment of the present invention. FIG. 2 is a conceptual view for explaining aspects of the apparatus for manufacturing a display device according to the embodiment of the present invention shown in FIG. 1. FIGS. 3-6 are views for explaining the operation of the apparatus for manufacturing a display device according to the embodiment of the present invention shown in FIG. 1.

Referring to FIGS. 1-6, an apparatus for manufacturing a display device according to an embodiment of the present invention includes: a stage ST on which a processing object is arranged; and a bending head BH.

First, the processing object according to an embodiment of the present invention will be described. The processing object may include a window WI, a first adhesive layer AD1, a first film member FI1, a second adhesive layer AD2, and a second film member FI2. The second film member FI2 has a bending area BA2 at one end thereof (e.g., the second film member FI2 is bent at one end).

The window WI may be made of a transparent material that transmits light. For example, the window WI may be made of glass and/or transparent plastic.

FIG. 1 illustrates an embodiment in which the window WI is a single layer, but the structure of the window WI is not limited thereto. For example, in another embodiment, the window WI may have a laminate structure in which a plurality of functional layers are laminated. The plurality of functional layers may include an adhesive layer.

In an embodiment, the window WI may be flexible. For example, the window WI may be made of a bendable, foldable, or rollable material or may have a structure that may be bent, folded, or rolled.

The first adhesive layer AD1 may be disposed on the window WI. The first adhesive layer AD1 may cover at least a part of the window WI or may cover the entire window WI. Although it is shown in FIG. 1 that the first adhesive layer AD1 covers only a part of the window WI, this is an example, and the application area of the first adhesive layer AD1 is not limited thereto.

The first adhesive layer AD1 may be placed on the window WI to attach the window WI to the first film member FI1, to be further described later.

In an embodiment, the first adhesive layer AD1 may include a photo-curable resin or thermosetting resin having high transmittance and adhesive performance. For example, the first adhesive layer AD1 may be formed by applying a resin, such as an acrylic resin, and then curing the resin by irradiating the resin with ultraviolet (UV) light. In another embodiment, the first adhesive layer AD1 may be formed of an optically clear adhesive (OCA).

The first film member FI1 may be disposed on the first adhesive layer AD1.

The first film member FI1 may have a thin plate shape. In an embodiment, the planar shape of the first film member FI1 may be a rectangular shape. However, the present invention is not limited thereto, and the planar shape of the first film member FI1 may include a curve or partial curve or may include a specific pattern.

In an embodiment, the first film member FI1 may be flexible. For example, the first film member FI1 may be made of a bendable, foldable, or rollable material or may have a structure that may be bent, folded, or rolled.

In an embodiment, a plurality of electronic elements may be formed on the first film member FI1. In this specification, the term "electronic element" may be understood as including or indicating a conductive line or a conductive electrode. The electronic elements may be formed on the first film member FI1 by patterning, or may be formed on the entire surface of the first film member FI1. The plurality of electronic elements may be made of a metal. However, the present invention is not limited thereto, and the plurality of electronic elements may include a conductive polymer material.

In an embodiment, the first film member FI1 may be a panel or a flexible printed circuit board, which are used in a display device. For example, the first film member FI1 may include a touch screen panel (TSP). However, this is an example, and the first film member FI1 is not limited thereto.

The first film member FI1 may be obtained by integrally forming one thin film. However, the present invention is not limited to this, and the first film member FI1 may be formed by connecting a plurality of thin films to each other. For example, the first film member FI1 may include a panel and a flexible printed circuit board electrically connected to the panel.

FIG. 1 shows an embodiment in which the first film member FI1 is a single layer, but the present invention is not limited thereto. In another embodiment, the first film member FI1 may be a laminate in which a plurality of functional layers are laminated. The plurality of functional layers are not limited, and for example, a protective layer, an adhesive layer, a shock absorbing layer, and the like may be included in the first film member FI1.

As shown in FIG. 1, one end of the first film member FI1 may be disposed outside (e.g., may extend beyond) one end of the window WI and/or one end of the first adhesive layer AD1 in a state where the first film member FI1 is flat, that is, in a state before bending. For example, a part or portion of the first film member FI1 may not overlap the first adhesive layer AD1. The portion of the first film member FI1 not overlapping (e.g., extending beyond) the first adhesive layer AD1 may be bent. Details thereof will be further described later.

The second adhesive layer AD2 may be disposed on the first film member FI1. For example, the first film member FI1 may be interposed between the second adhesive layer AD2 and the first adhesive layer AD1.

The second adhesive layer AD2 may be disposed on the first film member FI1 to attach the first film member FI1 to the second film member FI2, to be further described later.

In an embodiment, the second adhesive layer AD2 may include a photo-curable resin or thermosetting resin having high transmittance and adhesive performance. For example, the second adhesive layer AD2 may be formed by applying a resin, such as an acrylic resin, and then curing the resin by irradiating the resin with ultraviolet (UV) light. In another embodiment, the second adhesive layer AD2 may be formed of an optically clear adhesive (OCA).

In an embodiment, the second adhesive layer AD2 may be made of the same material as the first adhesive layer AD1. However, the present invention is not limited thereto, and in another embodiment, the second adhesive layer AD2 and the first adhesive layer AD1 may be made of materials different from each other.

In an embodiment, the application area of the second adhesive layer AD2 and the application area of the first adhesive layer AD1 may be substantially the same as each other. However, the present invention is not limited thereto. In another embodiment, the application area of the second adhesive layer AD2 and the application area of the first adhesive layer AD1 may be different from each other. For example, the end of the first adhesive layer AD1 and the end of the second adhesive layer AD2 may not be aligned with each other. Details thereof will be further described later with reference to the drawings.

As shown in FIG. 1, one end of the first film member FI1 may be disposed outside one end of the second adhesive layer AD2 in a state where the first film member FI1 is flat, that is, in a state before bending. For example, a part of the first film member FI1 may not overlap the second adhesive layer AD2. The portion of the first film member FI1 not overlapping the second adhesive layer AD2 may be bent, as will be further described later.

The second film member FI2 may be disposed on the second adhesive layer AD2.

In an embodiment, the second film member FI2 may be flexible. For example, the second film member FI2 may be made of a bendable, foldable, or rollable material or may have a structure that may be bent, folded, or rolled. However, the present invention is not limited thereto, and in another embodiment, the second film member FI2 may be rigid (e.g., may be made of a rigid material).

In an embodiment, a plurality of electronic elements may be formed on the second film member FI2, in the same or substantially the same manner as the first film member FI1. The electronic elements may be formed on the second film member FI2 by patterning, or may be formed on the entire surface of the second film member FI2. The plurality of electronic elements may be made of a metal. However, the present invention is not limited thereto, and the plurality of electronic elements may include a conductive polymer material.

In an embodiment, the second film member FI2 may be a panel or a flexible printed circuit board, which are used in a display device. For example, the second film member FI2 may be a display panel. However, this is an example, and the second film member FI2 is not limited thereto.

The second film member FI2 may be obtained by integrally forming one thin film. However, the present invention is not limited to this, and the second film member FI2 may be formed by connecting a plurality of thin films to each other. For example, the second film member FI2 may include a panel and a flexible printed circuit board electrically connected to the panel.

FIG. 1 shows an embodiment in which the second film member FI2 is a single layer, but the present invention is not limited thereto. In another embodiment, the second film member FI2 may be a laminate in which a plurality of functional layers are laminated. The plurality of functional layers are not limited, and for example, a protective layer, an adhesive layer, a shock absorbing layer, and the like may be included in the second film member FI2.

The second film member FI2 may have the bending area BA2.

For convenience of explanation, some terms will be defined with reference to FIG. 2.

FIG. 2 is a conceptual view for briefly explaining the first film member FI1 and the second film member FI2 of the apparatus for manufacturing a display device according to the embodiment of FIG. 1.

First, a bending line is defined. In this specification, the bending line may refer to a line where bending starts or ends. In other words, the bending line may refer to a boundary between a portion having a curvature of 0 (e.g., a flat portion) and a portion having a non-zero curvature (e.g., a curved portion).

In this specification, the bending area may refer to an area where portions having a non-zero curvature are continuously connected. In other words, the bending area may be defined between two bending lines.

In an embodiment, the first film member FI1 may have a first surface FI1_1 and a second surface FI1_2 that are opposed to or opposite each other. In an embodiment, the second film member FI2 may have a first surface FI2_1 and a second surface FI2_2 that are opposed to or opposite each other. The positions of the first surfaces and the second surfaces are specified as shown in FIG. 2. For example, in the state before bending, a surface near the window WI may be the first surface and a surface opposite to the window WI may be the second surface.

Referring to FIG. 2, the second film member FI2 may have the second bending area BA2. The second bending area BA2 may be an area defined between a first bending line BL2_1 of the second film member FI2 and a second bending line BL2_2 of the second film member FI2.

In an embodiment, the first bending line BL2_1 and the second bending line BL2_2 of the second film member FI2 may be aligned along (e.g., may extend along) a y-axis. However, the present invention is not limited thereto, and in another embodiment, the first bending line BL2_1 and the second bending line BL2_2 may not be aligned with each other.

In an embodiment, the second film member FI2 may have a first flat surface FI2_F1 and a second flat surface FI2_F2. The first flat surface FI2_F1 and the second flat surface FI2_F2 may face each other. Further, the first flat surface FI2_F1 and the second flat surface FI2_F2 may be connected to each other through the second bending area BA2. For example, the second bending area BA2 may be disposed between the first flat surface FI2_F1 and the second flat surface FI2_F2.

The first film member FI1 may be bent to include a first bending area BA1, to be further described later. The first bending area BA1 may be defined between a first bending line BL1_1 of the first film member FI1 and a second bending line BL1_2 of the first film member FI1.

In an embodiment, the first bending area BA1 may be bent along the outer side (or outer surface) of the second bending area BA2. For example, the first bending area BA1 may have a shape surrounding at least a part of the outer periphery of the second bending area BA2.

When the first film member FI1 is bent, the first film member FI1 may also have a first flat surface FI1_F1 and a second flat surface FI1_F2. The first flat surface FI1_F1 and the second flat surface FI1_F2 may face each other. Further, the first flat surface FI1_F1 and the second flat surface FI1_F2 may be connected to each other through the first bending area BA1. For example, the first bending area BA1 may be disposed between the first flat surface FI1_F1 and the second flat surface FI1_F2.

In an embodiment, the first bending line BL1_1 and second bending line BL1_2 of the first film member FI1 may be aligned along the y-axis. However, the present invention is not limited thereto, and in another embodiment, the first bending line BL1_1 and the second bending line BL1_2 may not be aligned with each other.

The elements and configurations defined in the description of FIG. 2 may be understood in the same sense throughout this specification.

Referring to FIG. 1, the description of the second film member FI2 will be continued. In an embodiment, the second bending area BA2 of the second film member FI2 may be formed by bending a flexible second film member FI2. However, the present invention is not limited thereto, and in another embodiment, the second bending area BA2 may be formed by processing a rigid second film member FI2.

A third adhesive layer AD3 may be disposed on the second film member FI2.

The third adhesive layer AD3 may be disposed on the second film member FI2 to attach the first flat surface FI2_F1 and the second flat surface FI2_F2 of the second film member FI2 to each other.

In an embodiment, the third adhesive layer AD3 may include a photo-curable resin or thermosetting resin having high transmittance and adhesive performance. For example, the third adhesive layer AD3 may be formed by applying a resin, such as an acrylic resin, and then curing the resin by irradiating the resin with ultraviolet (UV) light. In another embodiment, the third adhesive layer AD3 may be formed of an optically clear adhesive (OCA).

In still another embodiment, the third adhesive layer AD3 may include a double-sided tape.

FIG. 1 shows an embodiment in which the third adhesive layer AD3 is a single layer, but this is an example, and the present invention is not limited thereto. The third adhesive layer AD3 may be a laminate in which a plurality of functional layers are laminated. For example, the third adhesive layer AD3 may include a filler filling a space between the first flat surface FI2_F1 and the second flat surface FI2_F2 of the second film member FI2.

The third adhesive layer AD3 may fill at least a part of the space formed by the first flat surface FI2_F1, the second flat surface FI2_F2, and the second bending area BA2 of the second film member FI2.

FIG. 1 shows an embodiment in which the third adhesive layer AD3 fills a part of the space formed by the first flat surface FI2_F1, the second flat surface FI2_F2, and the second bending area BA2 of the second film member FI2, but the present invention is not limited thereto. In another embodiment, the third adhesive layer AD3 may fill the entire space formed by the first flat surface FI2_F1, the second flat surface FI2_F2, and the second bending area BA2 of the second film member FI2.

A fourth adhesive layer AD4 may be disposed on the second flat surface FI2_F2 of the second film member FI2.

The fourth adhesive layer AD4 is disposed on the second flat surface FI2_F2 of the second film member FI2 to attach the second surface FI1_2 of the first film member FI1 to the second film member FI2.

In an embodiment, the fourth adhesive layer AD4 may include a photo-curable resin or thermosetting resin having high transmittance and adhesive performance. For example, the fourth adhesive layer AD4 may be formed by applying a resin, such as an acrylic resin, and then curing the resin by irradiating the resin with ultraviolet (UV) light. In another embodiment, the fourth adhesive layer AD4 may be formed of an optically clear adhesive (OCA).

In still another embodiment, the fourth adhesive layer AD4 may include a double-sided tape.

The fourth adhesive layer AD4 may at least partially overlap the third adhesive layer AD3. However, the present invention is not limited thereto, and in another embodiment, the fourth adhesive layer AD4 and the third adhesive layer AD3 may not overlap each other.

FIG. 1 illustrates an embodiment in which the fourth adhesive layer AD4 is disposed on the second flat surface FI2_F2 of the second film member FI2, but the present invention is not limited thereto. In another embodiment, the fourth adhesive layer AD4 may also be disposed on the second surface FI1_2 of the first film member FI1.

Hereinafter, other components of an apparatus for manufacturing a display device according to an embodiment of the present invention will be described. The apparatus for manufacturing a display device according to an embodiment of the present invention may include the stage ST, a transfer unit TR, a stage support SU, a sensor unit SE (e.g., a sensor), a cylinder SY, and a rod RO.

The processing object T may be mounted on the stage ST. The stage ST may provide a space on which the processing object T is disposed and may fix the processing object T.

The transfer unit TR for moving the stage ST may be disposed under the stage ST. The transfer unit TR may have a mechanical structure such that the stage ST can be moved. In an embodiment, the stage ST may be slid in a horizontal direction. In this embodiment, the transfer unit TR may include a linear guide for sliding the stage ST. In addition, in order to reduce the sliding friction of the stage ST, the transfer unit TR may include an air floating device, such as an air cushion or air bearing. Thus, the stage ST can be moved with relatively low force.

Although an embodiment where the stage ST moves horizontally is illustrated, the movement of the stage ST is not limited thereto. For example, in accordance with an embodiment to be described later, the stage ST may be moved along the x-axis, the y-axis, and the z-axis or may be rotated about any one of the x-axis, the y-axis, and the z-axis.

The transfer unit TR may thus be configured such that the stage ST can be moved as discussed above.

The stage support SU may be disposed under the transfer unit TR. The stage support SU may support the stage ST during a process or during movement. For example, the support SU may provide space for the entire process.

In an embodiment, the sensor unit SE may be disposed on one side of the stage ST. The sensor unit SE may detect movement of the stage ST or measure force applied to the stage ST. In an embodiment, the sensor unit SE may include a load cell. For example, when the stage ST is moved, a constant deformation is applied to the load cell, and the force applied to the stage ST may be measured based on this deformation.

One side of the sensor unit SE may be provided with (e.g., may contact) the stage ST, and the other side of the sensor unit SE may be provided with (e.g., may contact) the cylinder SY via the rod RO connected with the cylinder SY. The rod RO may move into the cylinder SY when a force exceeding a certain value is applied thereto.

In an embodiment, when a force is applied to the stage ST in the −x-axis direction of FIG. 1, the sensor SE may measure the force and transmit the applied force to the rod RO. The rod RO does not move within a certain force range (e.g., the rod may resist movement up to a certain force), and thus, movement of the stage ST may be suppressed. The length of the rod RO in the state where the rod RO does not move may be d0, as shown in FIG. 1.

However, when a force exceeding the certain force range is applied, the rod RO moves or is inserted into the cylinder SY. Thus, the stage ST gradually moves. For example, the rod RO and the cylinder SY induce movement of the stage ST, and even if the stage ST moves, the magnitude of the force applied to the second film member FI2 can be reduced or minimized. Details thereof will be further described later with reference to FIGS. 3 and 4.

The apparatus for manufacturing a display device according to an embodiment of the present invention includes the bending head BH.

The bending head BH may be in contact with at least one side of the first film member FI1 to bend the first film member FI1. For example, the bending head BH may be adsorbed to (e.g., may be releasably connected to) the first surface FI1_1 of the first film member FI1 to fix the first film member FI1. The method in which the bending head BH is connected to (or fixed to) the first film member FI1 is not limited. For example, the bending head BH may fix the first film member FI1 by a vacuum adsorption method, an adhesion method, and/or a physical fixing method.

The bending head BH may have a bar shape extending in the y-axis direction. However, the present invention is not limited thereto, and the bending head BH may have a shape including a curved surface or a partially curved surface.

The apparatus for manufacturing a display device according to an embodiment of the present invention may include an alignment measurement unit CA. In an embodiment, the alignment measurement unit CA may include a camera.

In an embodiment, the alignment measurement unit CA may measure the alignment of the first film member FI1 and the second film member FI2. In an embodiment, an alignment mark may be formed on the first film member FI1 and the second film member FI2, and the alignment measurement unit CA may photograph the alignment marks to determine whether or not the first film member FI1 and the second film member FI2 are aligned.

In another embodiment, the alignment measurement unit CA may check the alignment of the first film member FI1 and the second film member FI2 by observing the outer peripheral shapes of the first film member FI1 and the second film member FI2 and confirming the input values and the arrangement of the outer peripheral shapes.

In an embodiment, the alignment measurement unit CA may be disposed over the third adhesive layer AD3 or the fourth adhesive layer AD4. For example, the alignment measurement unit CA determines whether or not the first film member FI1 is located at a correct position before attaching the second surface FI1_2 of the first film member FI1 to the second film member FI2.

The apparatus for manufacturing a display device according to an embodiment of the present invention may include a laser measurement unit LA.

The laser measurement unit LA may measure a gap g between the first bending area BA1 of the first film member FI1 and the second bending area BA2 of the second film member FI2.

In an embodiment, the laser measurement unit LA may be disposed to face the first bending area BA1 of the first film member FI1.

The laser measurement unit LA may measure the gap g between the first bending area BA1 and the second bending area BA2 by irradiating the first bending area BA1 with a laser beam. The laser beam emitted from the laser measurement unit LA passes through the first bending area BA1 or passes through a groove (or opening) formed on the first film member FI1 (the formation of the groove or opening in the first film member FI1 will be further described, in detail, later with respect to other embodiments) so as to measure the gap g between the first bending area BA1 and the second bending area BA2.

Hereinafter, the operation of the apparatus for manufacturing a display device according to an embodiment of the present invention will be described with reference to FIGS. 3-6.

The operation of the apparatus for manufacturing a display device according to the embodiment of the present invention shown in FIG. 1 may include the following acts.

First, the processing object T may be disposed on the stage ST. Then, the first film member FI1 may be bent. The bending the first film member FI1 may include bringing the bending head BH into contact with the first surface FI1_1 of the first film member FI1 and bending the first film member FI1 such that at least a part of one side of the first film member FI1 surrounds at least a part of the bending area BA2 of the second film member FI2 in a state where the bending head BH fixes (e.g., is fixed or connected to) the first film member FI1 (refer to the arrow direction in FIG. 3).

In an embodiment, the bending head BH may move along an arc-shaped trajectory. In another embodiment, the bending head BH may move along a trajectory having different curvatures (e.g., the bending head BH may move along an irregular arc-shaped trajectory). In still another embodiment, the bending head BH may move in a combination of one or more straight lines and one or more curves.

During the bending of the first film member FI1 such that at least a part of one side of the first film member FI1 surrounds at least a part of the bending area BA2 of the second film member FI2 in the state where the bending head BH fixes the first film member FI1, the first film member FI1 and the second film member FI2 may be spaced from (e.g., spaced apart from) each other. For example, the first film member FI1 and the second film member FI2 may not be in contact with each other during the bending of the first film member FI1.

When the first film member FI1 and the second film member FI2 are not in contact with each other, because the force applied to the stage ST is "0" or is not enough to move the stage ST, the stage ST may remain stationary.

After the bending, the bending head BH may be located above the second flat surface FI2_F2 of the second film member FI2 while fixing the first film member FI1.

Then, the alignment may be measured by the alignment measurement unit CA. After measuring the alignment by the alignment measurement unit CA, the first film member FI1 may be pressed and attached to the second film member FI2. During the pressing and attaching, the bending head BH presses the first film member FI1 toward the second film member FI2 to attach the first film member FI1 and the second film member FI2 together. In the illustrated embodiment, the bending head BH presses the first film member FI1, but the present invention is not limited thereto. In another embodiment, an additional pressing member may press the first film member FI1 to attach the first film member FI1 and the second film member FI2 together.

Figure 4:
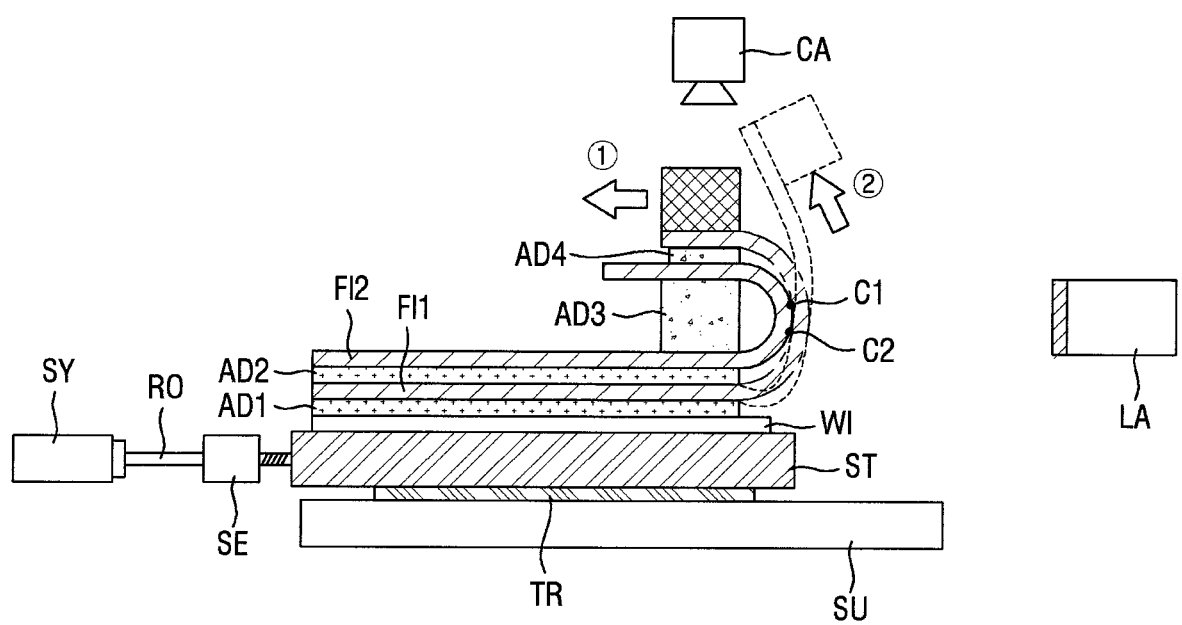

FIG. 4 illustrates a condition in which the first film member FI1 is in contact with the second film member FI2 during the bending of the first film member FI1 such that at least a part of one side of the first film member FI1 surrounds at least a part of the bending area BA2 of the second film member FI2 in the state where the bending head BH fixes the first film member FI1 during the operation of the apparatus for manufacturing a display device according to the embodiment shown in FIG. 1.

In this condition, the operation of the apparatus for manufacturing a display device may include measuring the force applied to the stage ST and/or pushing the rod RO toward the cylinder SY to move the stage ST.

During the bending (refer to ② of FIG. 4) or after the bending (refer to ① of FIG. 4), the first film member FI1 may at least partially contact the second film member FI2. In FIG. 4, contact points C1 and C2 between the first film member FI1 and the second film member FI2 are indicated by dots. However, in other instances, the first film member FI1 and the second film member FI2 may contact each other at a certain area.

When the first film member FI1 comes into contact with the second film member FI2, the first film member FI1 may push the second film member FI2 in the −x-axis direction. Thus, the stage ST may receive a force in the −x-axis direction.

Figure 5:
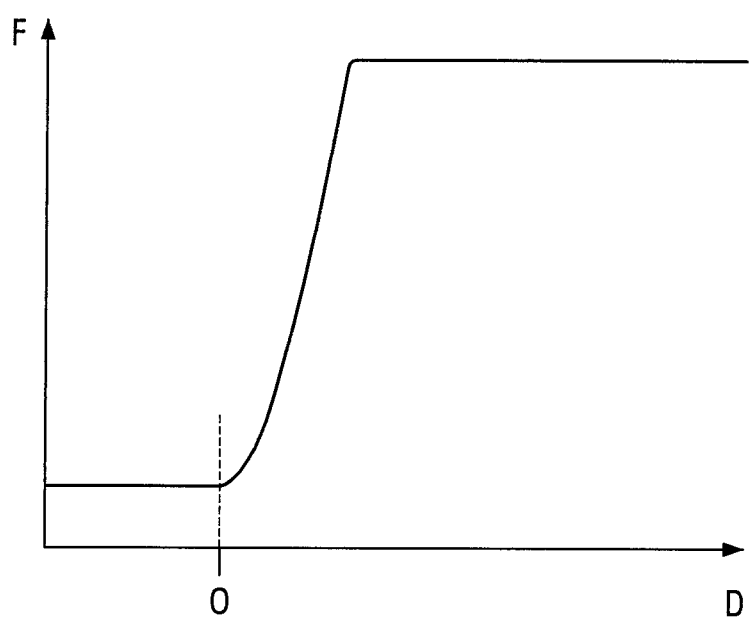

Referring to the graph of FIG. 5, the force applied to the stage ST in the −x-axis direction rapidly increases from the point of time when the first film member FI1 comes into contact with the second film member FI2 (e.g., a point at which the distance between the first film member FI1 and the second film member FI2 is "0").

In this condition, a force may be transferred to the sensor unit SE disposed on one side of the stage ST. The sensor unit SE may measure the force transferred to the stage ST. Because the second bending area BA2 of the second film member FI2 has a relatively mechanically weak structure, it is vulnerable to physical impact and may be damaged or broken if it receives too great a force. For example, when the first film member FI1 comes into contact with the second film member FI2 and thereby applies a force to the second film member FI2, the second bending area BA2 of the second film member FI2 may be damaged. The sensor unit SE may indirectly measure the force provided from the first film member FI1 to the second film member FI2 by measuring the force provided to the stage ST. Based on the measured force, when the sensor unit SE detects a force exceeding a certain force, the second film member FI2 may be prevented from being broken by stopping the process and/or rearranging some components.

Figure 6:
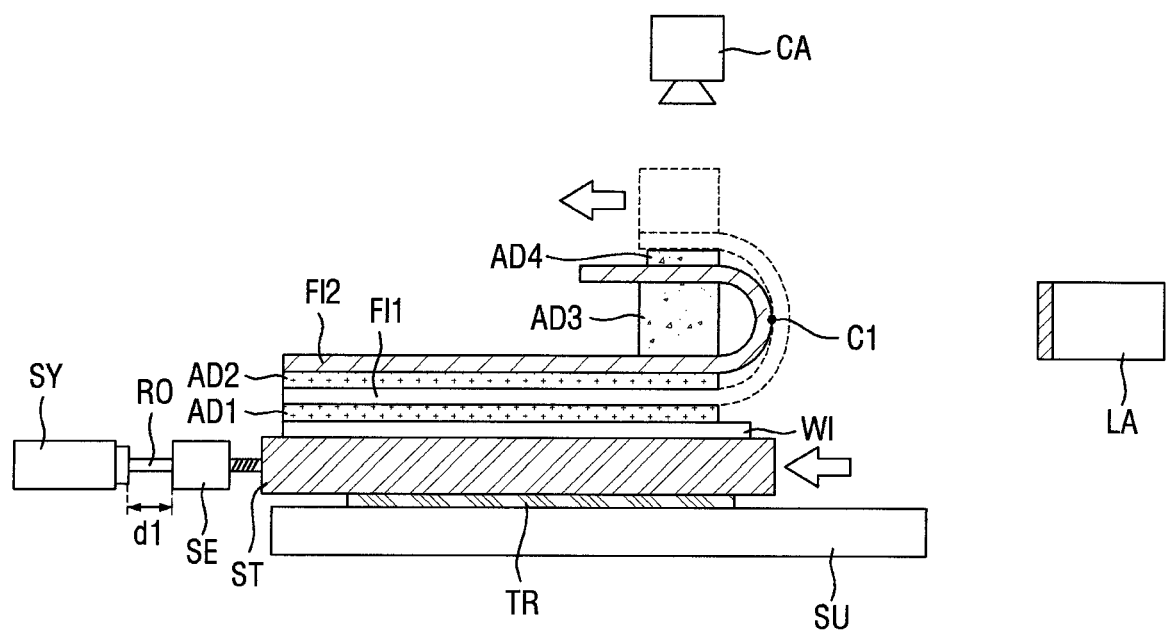
Figure 6:
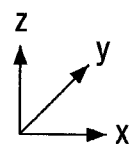

Then, referring to FIG. 6, the force transferred to the stage ST in the −x-axis direction may be transferred to the rod RO. As described above, the rod RO does not move within the certain force range and restricts movement of the stage ST in the −x-axis direction. However, if a force exceeding the certain force range is applied to the rod RO, the rod RO is gradually pushed or inserted into the cylinder SY, thereby preventing the stage ST from moving abruptly.

For example, the length of the rod RO may be d1, as shown in FIG. 6, which may be shorter than d0, as shown in FIG. 1.

The cylinder SY and the rod RO may serve to relax or damp the force applied by the first film member FI1 by slowly moving the stage ST when the first film member FI1 provides a force exceeding the durability of the second film member FI2 (which may be set before the process). Accordingly, it is possible to prevent damage to or reduce the chance of damage to the second film member FI2 due to the force exceeding the durability thereof.

The operation of the apparatus for manufacturing a display device according to the embodiment shown in FIG. 1 may include measuring the gap g between the first film member FI1 and the second film member FI2 by using the laser measurement unit LA.

The measuring of the gap g between the first film member FI1 and the second film member FI2 using the laser measurement unit LA may be performed during the bending of the first film member FI1 or may be performed before or after the measuring of the alignment by the alignment measurement unit CA.

The measuring of the gap g between the first film member FI1 and the second film member FI2 using the laser measurement unit LA may be performed continuously or intermittently during the process.

Further, in another embodiment, the measuring of the gap g between the first film member FI1 and the second film member FI2 using the laser measurement unit LA may be performed in real time.

When the measuring of the gap g between the first film member FI1 and the second film member FI2 using the laser measurement unit LA is performed, if the first film member FI1 and the second film member FI2 come into contact with each other in a manner that may cause defects during the process, the process is stopped or the process is performed after rearranging some components, thereby reducing the defective occurrence rate of products.

Next, an apparatus for manufacturing a display device according to another embodiment of the present invention will be described. In the following embodiments, the same or substantially the same components as those already described are referred to by the same reference numerals, and redundant descriptions thereof may be omitted or simplified.

Figure 6A:
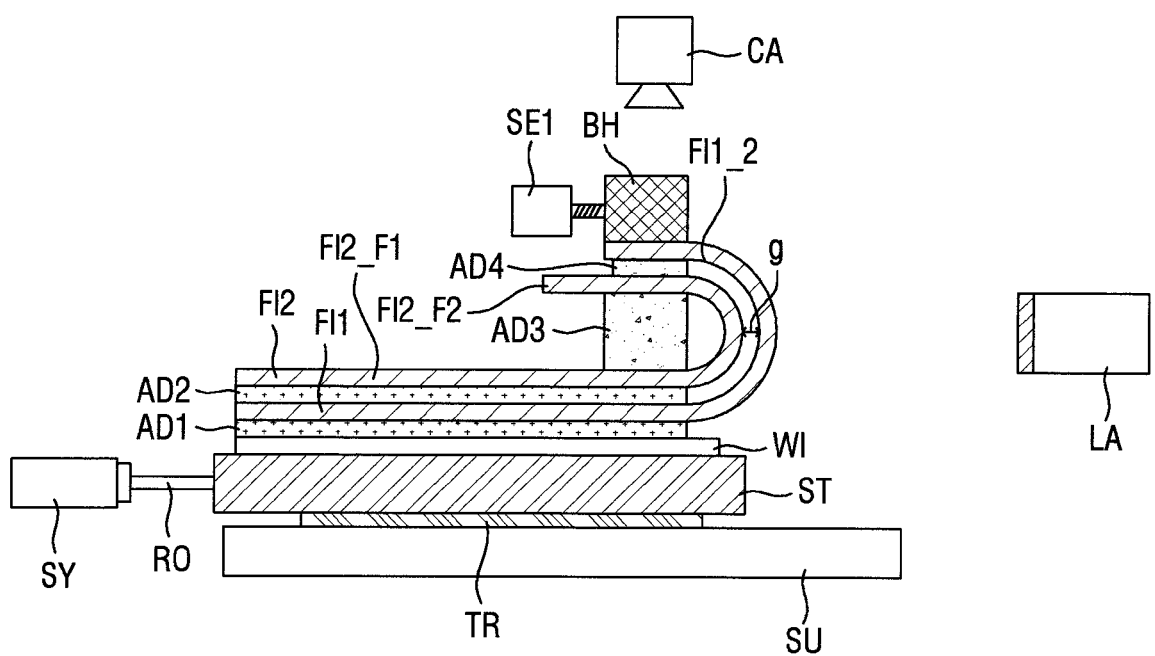
FIG. 6A is a sectional view of an apparatus for manufacturing a display device according to another embodiment of the present invention.

FIG. 6A is a sectional view of an apparatus for manufacturing a display device according to another embodiment of the present invention.

The apparatus for manufacturing a display device according to the embodiment of the present invention shown in FIG. 6A is different from the embodiment of FIG. 1 in that a second sensor unit SE1 is disposed on one side of the bending head BH. For convenience of explanation, hereinafter, the sensor unit SE of FIG. 1 will be referred to as a first sensor unit SE.

In an embodiment, the second sensor unit SE1 may be disposed on one side of the bending head BH. The second sensor unit SE1 may measure the force applied to the stage ST. In an embodiment, the second sensor unit SE1 may include a load cell.

For example, when the first film member FI1 and the second film member FI2 are in contact with each other as shown in FIG. 4 while the bending head BH is moved by pulling the second sensor unit SE1 connected to the bending head BH in the −x-axis direction, the first film member FI1 may push the second film member FI2 in the −x-axis direction. Thus, the stage ST may receive a force in the −x-axis direction.

For example, as the first film member FI1 and the second film member FI2 come into contact with each other, the second sensor unit SE1 receives a force in the +x-axis direction, and the magnitude of this force may be substantially equal to the magnitude of the force applied to the stage ST by the bending head BH. Thus, the second sensor unit SE1 may measure the force applied to the stage ST by the bending head BH based on the magnitude of this force.

When the second sensor unit SE1 is disposed on one side of the bending head BH, the cylinder SY and the rod RO connected to the cylinder SY may be disposed on one side of the stage ST. For example, in the embodiment of FIG. 6A, different from the embodiment of FIG. 1, the rod RO may directly contact with the stage ST.

FIG. 6A shows an embodiment in which the first sensor unit SE, disposed on one side of the stage ST in the embodiment of FIG. 1, is omitted, but the present invention is not limited thereto. In another embodiment, both the first sensor unit SE and the second sensor unit SE1 may be included. For example, an apparatus for manufacturing a display device according to another embodiment of the present invention may include both the first sensor unit SE and the second sensor unit SE1.

Figure 7:
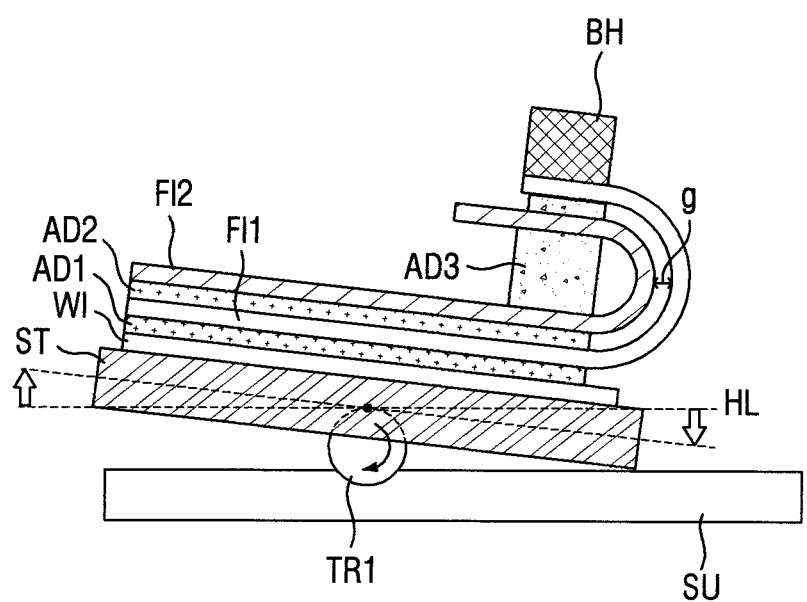
FIG. 7 is a sectional view of an apparatus for manufacturing a display device according to another embodiment of the present invention.

FIG. 7 is a sectional view of an apparatus for manufacturing a display device according to another embodiment of the present invention.

The apparatus for manufacturing a display device according to the embodiment of the present invention shown in FIG. 7 is different from the embodiment of FIG. 1 in that the transfer unit TR includes a rotating device.

In the apparatus for manufacturing a display device according to the embodiment of the present invention of FIG. 7, the transfer unit TR may include a rotating device. In this embodiment, the stage ST may rotate at least partially with the y-axis as a rotation axis.

According to this embodiment, one end of the stage ST moves downward with respect to a virtual horizontal line HL and the other end thereof moves upward with respect to the virtual horizontal line HL. For example, the operation of the apparatus for manufacturing a display device according to this embodiment may include rotating the stage ST to move one end of the stage ST downward.

When one end of the stage ST moves downward with respect to the virtual horizontal line HL while the first film member FI1 is bent such that at least a part of one side of the first film member FI1 surrounds at least a part of the bending area BA2 of the second film member FI2 in the state where the bending head BH fixes the first film member FI1, the first film member FI1 may be pulled down under the influence of gravity so that the gap g between the first film member FI1 and the second film member FI2 can be maintained. Thus, contact between the first film member FI1 and the second film member FI2 can be minimized or prevented.

Figure 8:
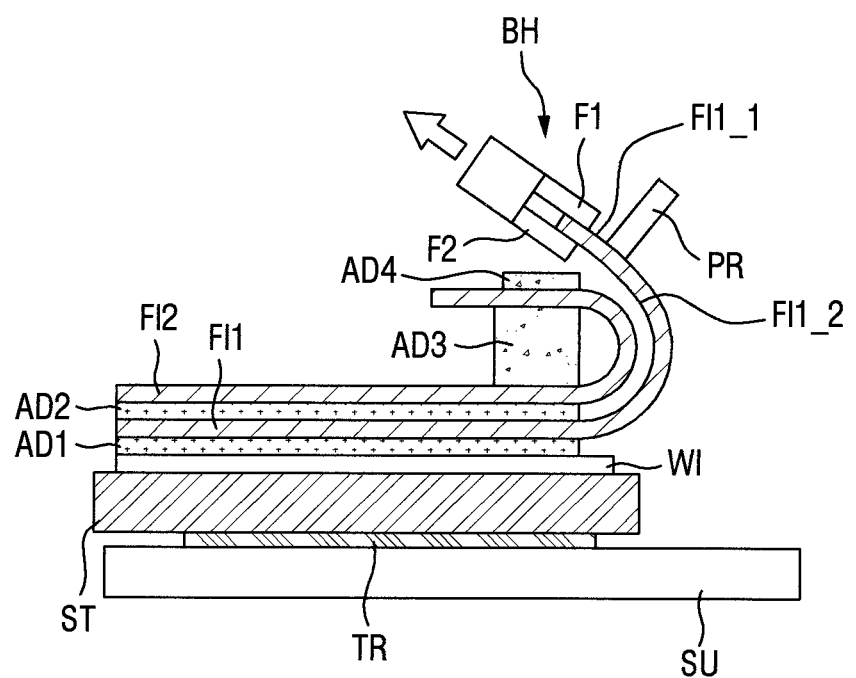
FIG. 8 is a sectional view of an apparatus for manufacturing a display device according to another embodiment of the present invention.

FIG. 8 is a sectional view of an apparatus for manufacturing a display device according to another embodiment of the present invention. The apparatus for manufacturing a display device according to the embodiment of the present invention shown in FIG. 8 is different from the embodiment of FIG. 1 in that the bending head BH1 includes a first finger FI and a second finger F2.

In an embodiment, the bending head BH1 may include the first finger F1 and the second finger F2 that are spaced from (e.g., spaced apart from) each other.

The first finger F1 is in contact with the second surface FI2_2 of the first film member FI1 and the second finger F2 is in contact with the first surface FI1_1 of the first film member FI1 so as to fix the first film member FI1. As such, when the first finger F1 and the second finger F2 are in contact with opposite surfaces of the first film member FI1 to fix the first film member FI1, the first film member FI1 can be more stably fixed compared to when the bending head BH is in contact with only one side of the first film member FI1.

However, in this embodiment, it may be difficult to align or press the first film member FI1 due to the space occupied by the second finger F2. Accordingly, the apparatus for manufacturing a display device according to this embodiment may further include an additional pressing member PR for fixing and pressing the first film member FI1.

In this embodiment, the operation of the apparatus for manufacturing a display device according to this embodiment may include allowing the first finger F1 and second finger F2 of the bending head BH to bring the pressing member PR into contact with the first film member FI1, detaching the bending head BH, and pressing the first film member FI1 with the pressing member PR to attach the first film member FI1 and the second film member FI2 together after the bending of the first bending member FI1 such that at least a part of one side of the first film member FI1 at least partially surrounds the second bending area BA2 of the second film member FI2.

The attaching of the pressing member PR may be performed by, for example, vacuum attaching or adhesive attaching.

Figure 9:
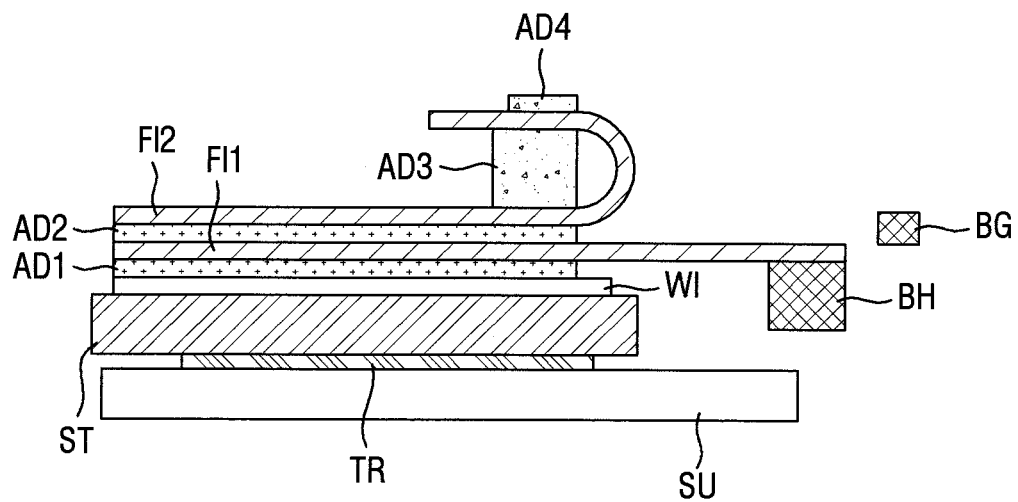
FIG. 9 is a sectional view of an apparatus for manufacturing a display device according to another embodiment of the present invention.

FIG. 9 is a sectional view of an apparatus for manufacturing a display device according to another embodiment of the present invention. The apparatus for manufacturing a display device according to the embodiment of the present invention shown in FIG. 9 may further include a bending guide BG for assisting the bending of the first bending member FI1 by the bending head BH.

The bending guide BG may serve to support the first film member FI1 and maintain the shape thereof and/or to maintain the gap g between the first film member FI1 and the second film member FI2 when the bending guide BG intervenes in the middle of the bending of the first film member FI1 such that at least a part of one side of the first film member FI1 surrounds at least a part of the bending area BA2 of the second film member FI2 in the state where the bending head BH fixes the first film member FI1.

Figure 10:
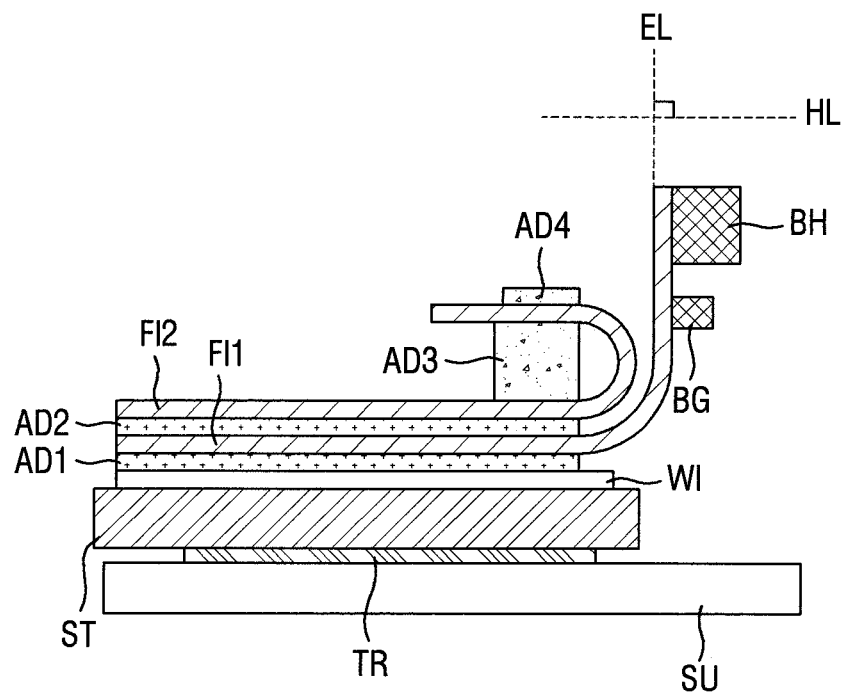
FIGS. 10 and 11 are views for explaining the operation of the apparatus for manufacturing a display device according to the embodiment of FIG. 9.
Figure 10:
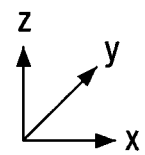
Figure 11:
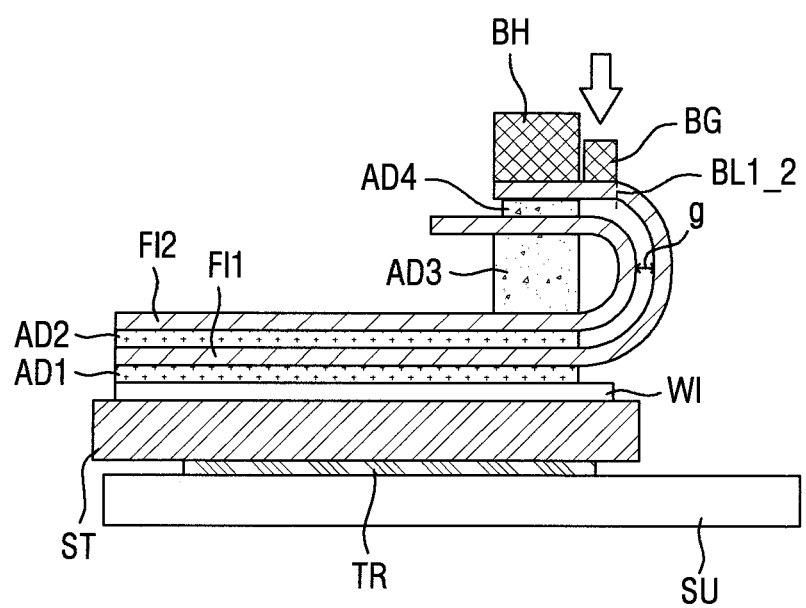

In order to further explain the operation of the apparatus for manufacturing a display device according to the embodiment of FIG. 9, FIGS. 10 and 11 are referred to. FIGS. 10 and 11 are views for explaining the operation of the apparatus for manufacturing a display device according to the embodiment of FIG. 9.

Referring to FIG. 10, in the operation of the apparatus for manufacturing a display device according to the embodiment of FIG. 9, the bending of the first film member FI1 such that at least a part of one side of the first film member FI1 surrounds at least a part of the bending area BA2 of the second film member FI2 in the state where the bending head BH fixes the first film member FI1 may include bending the first film member FI1 such that an angle formed by an extension line EL of the first film member FI1 and the virtual horizontal line HL is a right angle or substantially a right angle (e.g., a first bending step); bringing the bending guide BG into contact with the first film member FI1 in the state where the angle formed by the extension line EL of the first film member FI1 and the virtual horizontal line HL is a right angle; and allowing the bending head BH to bend the first film member FI1 in a state where the bending guide BG is in contact with the first film member FI1 (e.g., a second bending step).

First, the first film member FI1 may be bent such that the angle formed by the extension line EL of the first film member FI1 and the virtual horizontal line HL is a right angle (e.g., the first bending step). However, the angle formed by the extension line EL of the first film member FI1 and the virtual horizontal line HL is not limited to a right angle or substantially a right angle and may be an angle in a range of about 70° to about 80°.

Then, the bending guide BG may be brought into contact with the first film member FI1. When the bending guide BG is attached to the first film member FI1, a force (e.g., a tensile force) acting on the first film member FI1 may change depending on the bending, and thus, the bending of the first film member FI1 may be influenced by the change in force.

Then, referring to FIG. 11, the first film member FI1 may be bent by the bending head BH in a state where the bending guide BG is in contact with the first film member FI1 (e.g., the second bending step).

When the bending is performed with the bending guide BG being attached to the first film member FI1, the position of the second bending line BL1_2 of the first film member FI1 can be changed or adjusted. For example, in this embodiment, compared to when the bending guide BG is not attached to the first film member FI1 or when the bending guide BG is omitted, the position of the second bending line BL1_2 may be shifted in the x-axis direction, and thus, the gap g between the first film member FI1 and the second film member FI2 may be increased or stably maintained.

Figure 12:
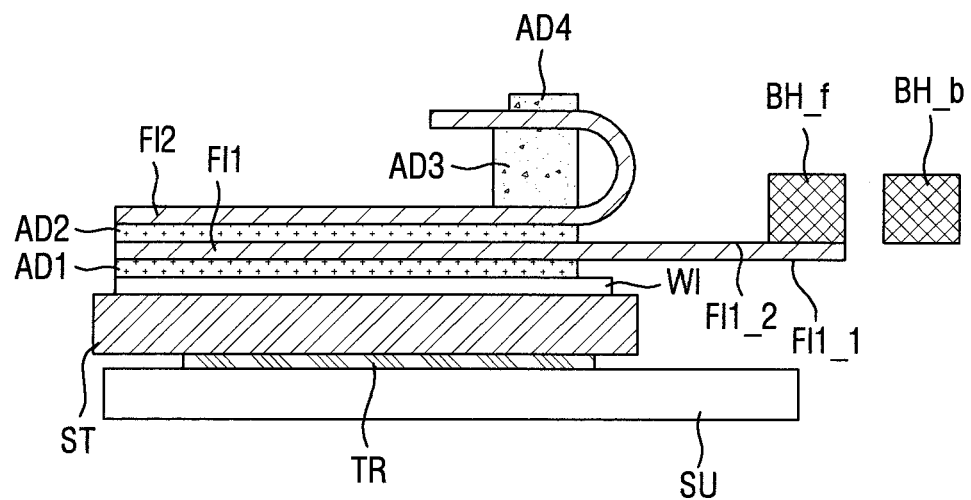
FIGS. 12-14 are sectional views of an apparatus for manufacturing a display device according to another embodiment of the present invention.
Figure 12:
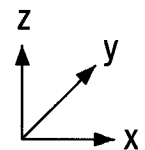
Figure 13:
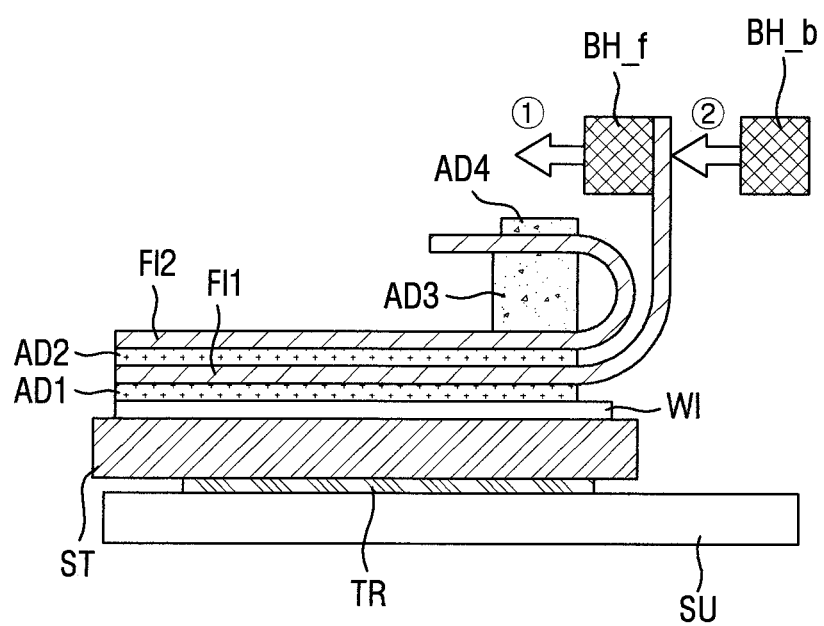

FIGS. 12 and 13 are sectional views of an apparatus for manufacturing a display device according to another embodiment of the present invention. The apparatus for manufacturing a display device according to the embodiment of the present invention shown in FIGS. 12 and 13 is different from the embodiment of FIG. 1 in that this apparatus includes a front bending head BH_f and a back bending head BH_b.

In the operation of the apparatus for manufacturing a display device of FIGS. 12 and 13, the bending of the first film member FI1 such that at least a part of one side of the first film member FI1 surrounds at least a part of the bending area BA2 of the second film member FI2 in the state where the bending head BH fixes the first film member FI1 may include bending the first film member FI1 such that the angle formed by the extension line EL of the first film member FI1 and the virtual horizontal line HL is a right angle in a state where the front bending head BH_f is in contact with the second surface FI1_2 of the first film member FI1 (e.g., a first bending step); detaching the front bending head BH_f from the first film member FI1 and bringing the back bending head BH_b into contact with the first surface FI1_1 of the first film member FI1 in a state where the angle formed by the extension line EL of the first film member FI1 and the virtual horizontal line HL is a right angle; and bending the first film member FI1 in a state where the back bending head BH_b is in contact with the first surface FI1_1 of the first film member FI1 (e.g., a second bending step).

First, the first film member FI1 may be bent such that the angle formed by the extension line EL of the first film member FI1 and the virtual horizontal line HL is a right angle or substantially a right angle in the state where the front bending head BH_f is in contact with the second surface FI1_2 of the first film member FI1 (e.g., the first bending step). However, the angle formed by the extension line EL of the first film member FI1 and the virtual horizontal line HL is not limited to a right angle or substantially a right angle and may be an angle in a range of about 70° to about 80°.

Then, referring to FIG. 13, the front bending head BH_f may be detached from the first film member FI1 and the back bending head BH_b may be brought into contact with the first surface FI1_1 of the first film member FI1 in the state where the angle formed by the extension line EL of the first film member FI1 and the virtual horizontal line HL is a right angle. The detaching of the front bending head BH_f (refer to ① of FIG. 13) and the contacting of the back bending head BH_b (refer to ② of FIG. 13) may be performed concurrently, simultaneously, or sequentially.

Figure 14:
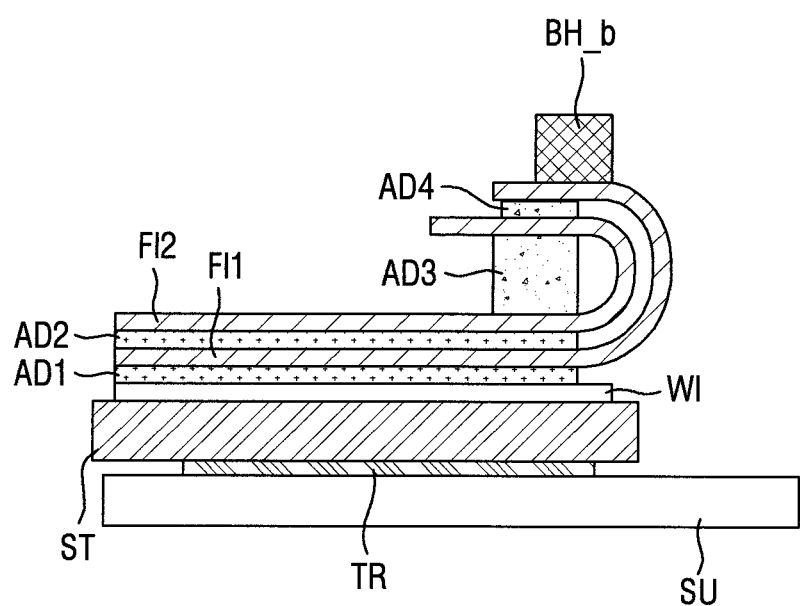

Then, referring to FIG. 14, the first film member FI1 may be bent in the state where the back bending head BH_b is in contact with the first surface FI1_1 of the first film member FI1 (e.g., the second bending step).

When some of the bending is performed by pulling the first film member FI1 from the front side (e.g., the first bending step), the bending can be more smoothly performed.

Further, when the remaining bending is performed by pushing the first film member FI1 from the back side (e.g., the second bending step), sufficient space can be secured for the aligning and pressing of the first film member FI1 and the first film member FI1 may be more accurately aligned and pressed.

Figure 15:
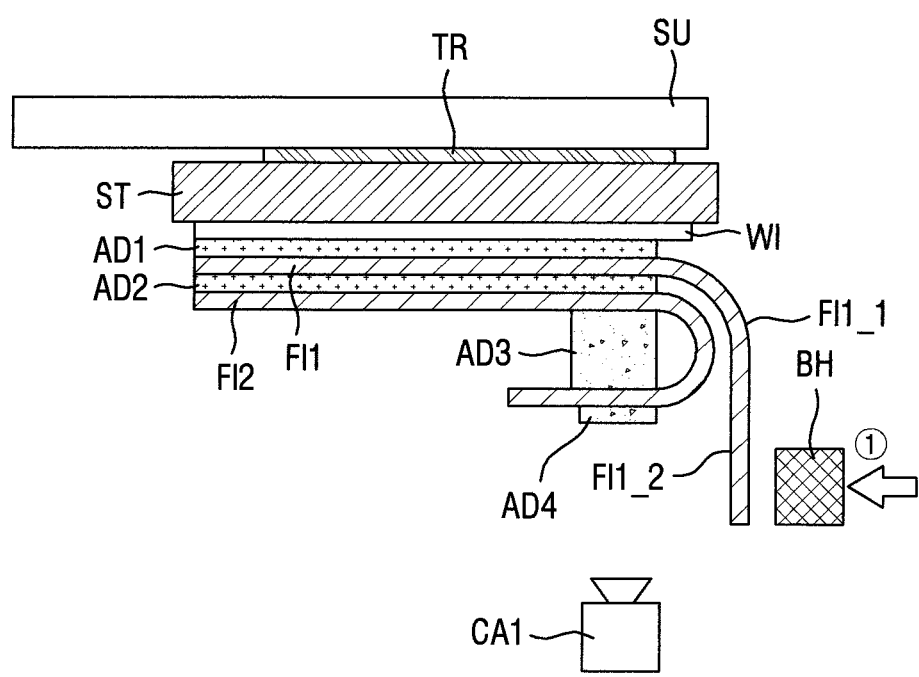
FIGS. 15 and 16 are sectional views of an apparatus for manufacturing a display device according to another embodiment of the present invention.
Figure 16:
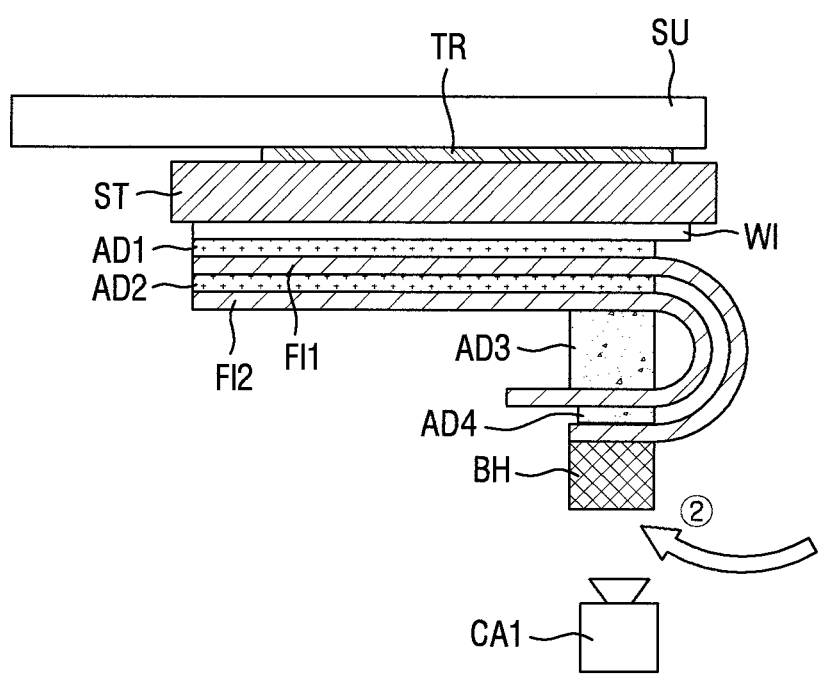

FIGS. 15 and 16 are sectional views of an apparatus for manufacturing a display device according to another embodiment of the present invention. The apparatus for manufacturing a display device according to the embodiment of the present invention shown in FIGS. 15 and 16 may be configured such that the stage support SU is disposed at an uppermost position (e.g., an uppermost position with respect to gravity) and the transfer unit TR, the stage ST, and the processing object T are sequentially disposed under the stage support SU.

In this embodiment, an alignment measurement unit CA1 may be disposed at the lower portion (e.g., under the processing object T) and may face toward the upper portion (e.g., may face upwards) to measure the alignment.

As shown in FIG. 15, when the processing object T is disposed to be suspended from the stage ST, a part of the first film member FI1 in an initial state where no external force is applied may be pulled down by the influence of gravity (e.g., may hang down).

In this embodiment, the bending of the first film member FI1 may include bringing the bending head BH into contact with the first film member FI1 (refer to ① of FIG. 15) and bending the first film member FI1 such that at least a part of one side of the first film member FI1 surrounds at least a part of the bending area BA2 of the second film member FI2 in the state where the bending head BH fixes the first film member FI1 (refer to ② of FIG. 16).

In FIG. 16, the bending of the first film member FI1 such that at least a part of one side of the first film member FI1 surrounds at least a part of the bending area BA2 of the second film member FI2 in the state where the bending head BH fixes the first film member FI1 is different from the similar process in the embodiment of FIG. 1 in that the bending head BH pushes up the first film member FI1.

Further, in FIG. 16, the measuring of the alignment by the alignment measurement unit CA1 is different from the similar process in the embodiment of FIG. 1 in that alignment measurement unit CA1 is pointed upwards.

Figure 17:
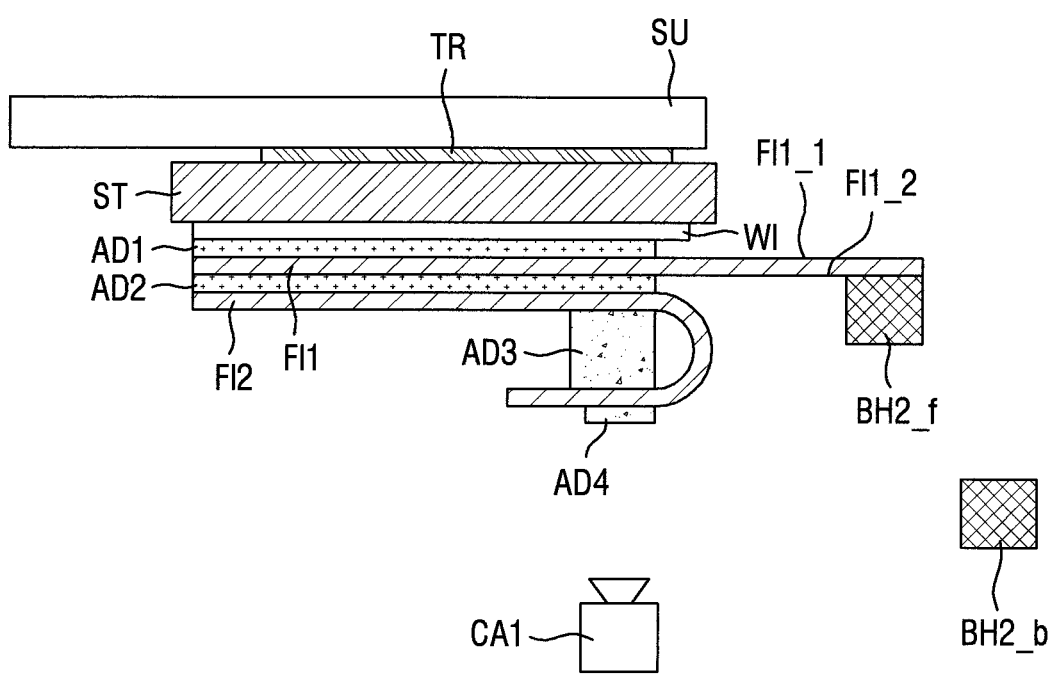
FIGS. 17-19 are sectional views of an apparatus for manufacturing a display device according to another embodiment of the present invention.
Figure 18:
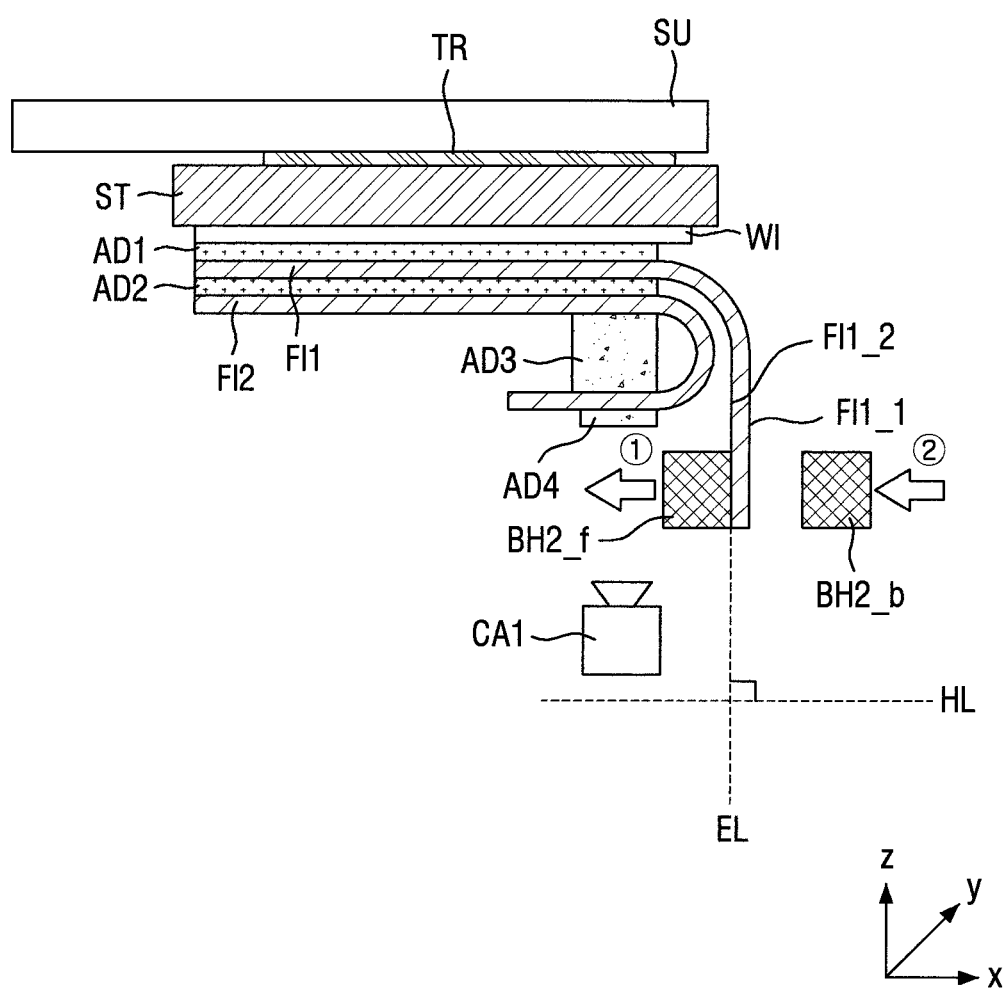
Figure 19:
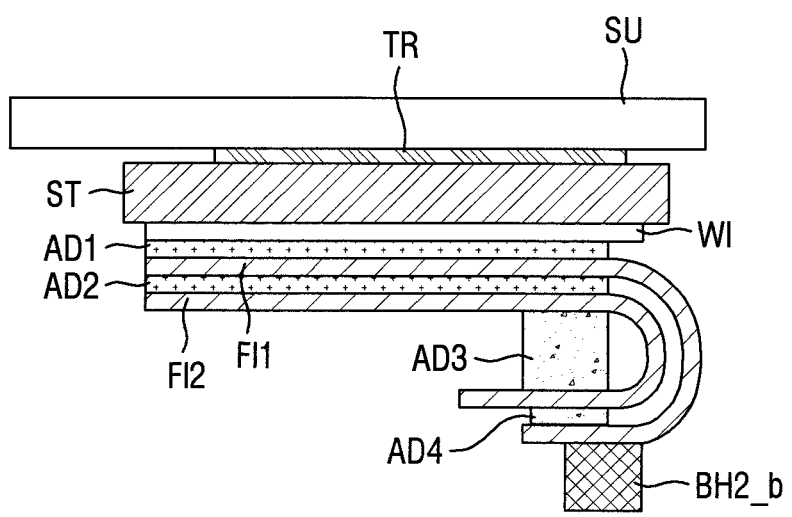

FIGS. 17-19 are sectional views of an apparatus for manufacturing a display device according to another embodiment of the present invention. The apparatus for manufacturing a display device according to the embodiment of the present invention shown in FIGS. 17-19 is different from the embodiment of FIG. 15 in that this apparatus includes a front bending head BH2_f and a back bending head BH2_b.

In the operation of the apparatus for manufacturing a display device according to the embodiment of FIGS. 17-19, the bending of the first film member FI1 such that at least a part of one side of the first film member FI1 surrounds at least a part of the bending area BA2 of the second film member FI2 in the state where the bending head BH fixes the first film member FI1 may include bending the first film member FI1 such that the angle formed by the extension line EL of the first film member FI1 and the virtual horizontal line HL is a right angle in a state where the front bending head BH2_f is in contact with the second surface FI1_2 of the first film member FI1 (e.g., a first bending step); detaching the front bending head BH2_f from the first film member FI1 and bringing the back bending head BH2_b into contact with the first surface FI1_1 of the first film member FI1 in a state where the angle formed by the extension line EL of the first film member FI1 and the virtual horizontal line HL is a right angle; and bending the first film member FI1 in a state where the back bending head BH2_b is in contact with the first surface FI1_1 of the first film member FI1 (e.g., a second bending step).

First, the first film member FI1 may be bent such that the angle formed by the extension line EL of the first film member FI1 and the virtual horizontal line HL is a right angle or substantially a right angle in the state where the front bending head BH2_f is in contact with the second surface FI1_2 of the first film member FI1 (e.g., a first bending step). However, the angle formed by the extension line EL of the first film member FI1 and the virtual horizontal line HL is not limited thereto, and may be an angle or substantially a right angle in a range of about 70° to about 80°.

Then, referring to FIG. 18, the front bending head BH2_f may be detached from the first film member FI1 and the back bending head BH2_b may be brought into contact with the first surface FI1_1 of the first film member FI1 in the state where the angle formed by the extension line EL of the first film member FI1 and the virtual horizontal line HL is a right angle. The detaching of the front bending head BH2_f from the first film member FI1 (refer to ① of FIG. 18) and the contacting of the back bending head BH2_b with the first film member FI1 (refer to ② of FIG. 18) may be performed concurrently, simultaneously, or sequentially.

Then, referring to FIG. 19, the first film member FI1 may be bent in the state where the back bending head BH2_b is in contact with the first surface FI1_1 of the first film member FI1 (e.g., a second bending step).

When some of the bending of the first film member FI1 is performed by pulling from the front side (e.g., the first bending step), the bending can be more smoothly performed.

Further, when the remaining bending of the first film member FI1 is performed by pushing from the back side (e.g., the second bending step), sufficient space can be secured during the aligning and pressing of the first film member FI1 and the first film member FI1 may be more accurately aligned and pressed.

Figure 20:
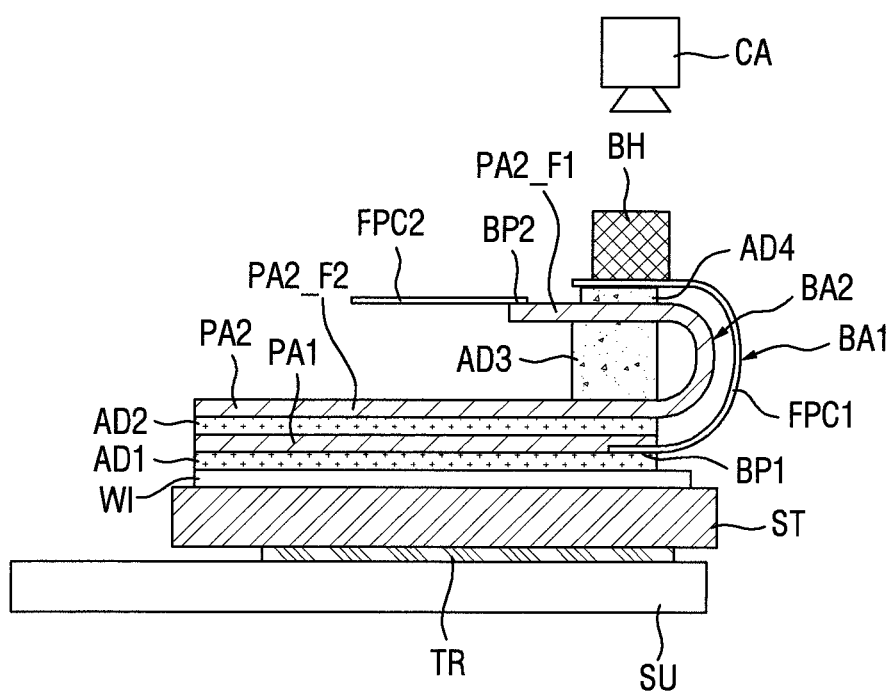
FIG. 20 is a sectional view of an apparatus for manufacturing a display device according to another embodiment of the present invention.
Figure 21:
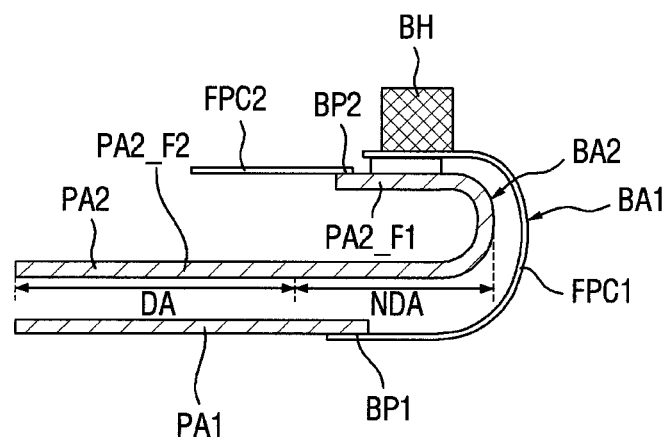
FIG. 21 is a conceptual view for explaining aspects of the apparatus for manufacturing a display device according to the embodiment of FIG. 20.

FIG. 20 is a sectional view of an apparatus for manufacturing a display device according to another embodiment of the present invention. FIG. 21 is a conceptual view for explaining aspects of the apparatus for manufacturing a display device according to the embodiment of FIG. 21.

Figure 22:
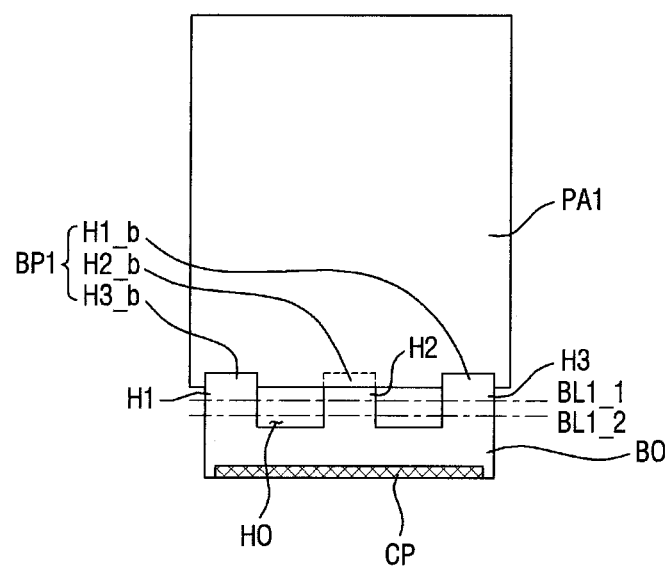
FIG. 22 is a partial plan view of a display device according to an embodiment of the present invention.
Figure 22:
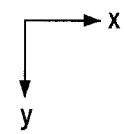
Figure 23:
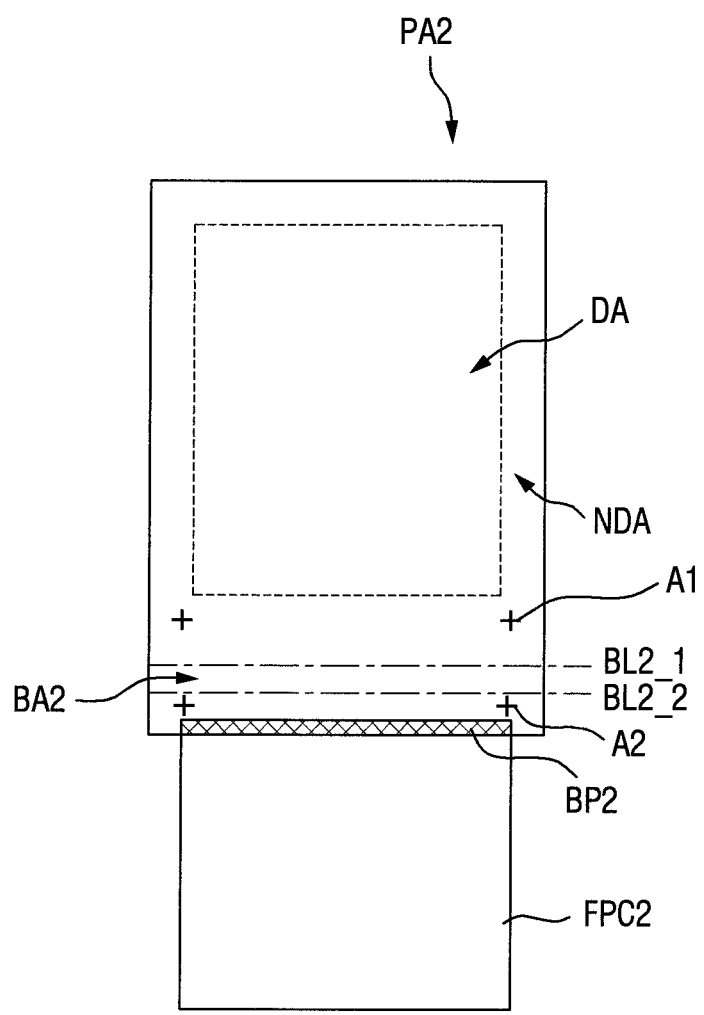
FIG. 23 is a partial plan view of a display device according to another embodiment of the present invention.

FIG. 22 is a partial plan view of a display device according to an embodiment of the present invention. FIG. 23 is a partial plan view of a display device according to another embodiment of the present invention.

Referring to FIGS. 20-23, the first film member FI1 of a display device according to embodiments of the present invention includes a first panel PA1 and a first flexible printed circuit board FPC1 and the second film member FI2 of a display device according to embodiments of the present invention includes a second panel PA2 and a second flexible printed circuit board FPC2.

Referring to FIG. 20, the first panel PA1 and the first flexible printed circuit board FPC1 may be disposed on the first adhesive layer AD1. For example, the first adhesive layer AD1 may attach the first panel PA1 and the first flexible printed circuit board FPC1 to the window WI.

In an embodiment, the first panel PA1 may be a touch screen panel (TSP), and in such an embodiment, the first flexible printed circuit board FPC1 serves to generate a control signal or transmit a control signal to the first panel PA1.

The first panel PA1 and the first flexible printed circuit board FPC1 may be attached to each other at a first contact portion BP1 disposed on one side of the first panel PA1. The first panel PA1 and the first flexible printed circuit board FPC1 may be in contact with each other through an anisotropic conductive film (ACF). In some embodiments, the first panel PA1 and the first flexible printed circuit board FPC1 may be electrically connected to each other.

In an embodiment, the first panel PA1 may be rigid and the first flexible printed circuit board FPC1 may be flexible.

In another embodiment, both the first panel PA1 and the first flexible printed circuit board FPC1 may be flexible.

In an embodiment, the first panel PA1 and the first flexible printed circuit board FPC1 are independently formed and connected to each other, but in another embodiment, the first panel PA1 and the first flexible printed circuit board FPC1 may be integrally formed. In this embodiment, both the first panel PA1 and the first flexible printed circuit board FPC1 may be flexible.

In an embodiment, the first bending area BA1 may be formed on the first flexible printed circuit board FPC1. For example, the first panel PA1 may have a flat surface, and the first flexible printed circuit board FPC1 may have the first bending area BA1.

A second adhesive layer AD2 may be disposed on the first panel PA1. The second adhesive layer AD2 may be the same or substantially the same as that described above in the apparatus for manufacturing a display device according to other embodiments of the present invention.

The second panel PA2 may be disposed on the second adhesive layer AD2. In an embodiment, the second panel PA2 may be a display panel.

The second flexible printed circuit board FPC2 may be disposed on one side of the second panel PA2. The second flexible printed circuit board FPC2 serves to generate a control signal or transmit the generated control signal to the second panel PA2.

A driving chip for generating a driving signal may be directly mounted on the second panel PA2, mounted on the second flexible printed circuit board FPC2, or mounted on an additional printed circuit board.

The second panel PA2 may have a second bending area BA2 on one side thereof. The second bending area BA2 of the second panel PA2 may be formed by bending a flexible second panel PA2 or by processing a rigid second panel PA2.

FIG. 20 illustrates an embodiment in which the second panel PA2 has the second bending area BA2, but the present invention is not limited thereto.

In another embodiment, the second panel PA2 may have a flat surface and the second flexible printed circuit board FPC2 may be bent to have the second bending area BA2.

Further, FIG. 20 shows an embodiment in which the second panel PA2 and the second flexible printed circuit board FPC2 are independently formed and connected to each other. However, in another embodiment, the second panel PA2 and the second flexible printed circuit board FPC2 may be integrally formed. In such an embodiment, both the second panel PA2 and the second flexible printed circuit board FPC2 may be flexible.

In an embodiment, the second panel PA2 may have a first flat surface PA2_F1 and a second flat surface PA2_F2. The first flat surface PA2_F1 and second flat surface PA2_F2 of the second panel PA2 may be opposed to each other and may be spaced from (e.g., spaced apart from) each other.

A third adhesive layer AD3 may be interposed between the first flat surface PA2_F1 and the second flat surface PA2_F2 of the second panel PA2. The third adhesive layer AD3 may be the same or substantially the same as that described above in the apparatus for manufacturing a display device according to other embodiments of the present invention.

For example, the second panel PA2 and the second flexible printed circuit board FPC2 may be attached to each other at a second contact portion BP2 disposed on one side of the second flat surface PA2_F2 of the second panel PA2.

The second panel PA2 and the second flexible printed circuit board FPC2 may be in contact with each other through an anisotropic conductive film (ACF). In some embodiments, the second panel PA2 and the second flexible printed circuit board FPC2 may be electrically connected to each other.

A fourth adhesive layer AD4 may be formed on (or applied to) the second flat surface PA_F2, for example, on a side opposite to the side on which the third adhesive layer AD3 is formed (or applied). The fourth adhesive layer AD4 may be the same or substantially the same as that described above in the apparatus for manufacturing a display device according to other embodiments of the present invention.

The first flexible printed circuit board FPC1 may be disposed on the fourth adhesive layer AD4. The first flexible printed circuit board FPC1 may be bent and extended from the first panel PA1 to the upper portion of the fourth adhesive layer AD4.

Accordingly, a part of the first flexible printed circuit board FPC1 may be attached to the second flat surface PA2_F2 of the second panel PA2 by the fourth adhesive layer AD4.

Next, the operation of an apparatus for manufacturing a display device according to an embodiment of the present invention will be described.

First, the processing object T having the above-described configuration may be provided and disposed on the stage ST. Then, the first flexible printed circuit board FPC1 may be bent. The bending of the first flexible printed circuit board FPC1 may include bringing the bending head BH into contact with the first flexible printed circuit board FPC1 and bending the first flexible printed circuit board FPC1 such that at least a part of one side of the first flexible printed circuit board FPC1 surrounds at least a part of the bending area BA2 of the second panel PA2 in a state where the bending head BH fixes the first flexible printed circuit board FPC1.

In an embodiment, the trajectory of the bending head BH may be arc-shaped. In another embodiment, the trajectory of the bending head BH may be arcs having different curvatures. In still another embodiment, the trajectory of the bending head BH may be a combination of one or more straight lines and one or more curves.

During the bending of the first flexible printed circuit board FPC1 such that at least a part of one side of the first flexible printed circuit board FPC1 surrounds at least a part of the bending area BA2 of the second panel PA2 in the state where the bending head BH fixes the first flexible printed circuit board FPC1, the first flexible printed circuit board FPC1 and the second panel PA2 may be spaced from (e.g., spaced apart from) each other. For example, the first flexible printed circuit board FPC1 and the second panel PA2 may not contact each other.

After the bending of the first flexible printed circuit board FPC1, the bending head BH may be located above the second flat surface PA2_F2 of the second panel PA2 while fixing the first flexible printed circuit board FPC1.

Then, the alignment may be measured by the alignment measurement unit CA. After measuring the alignment, the first flexible printed circuit board FPC1 may be pressed and attached to the second panel PA2. To attach the first flexible printed circuit board FPC1 and the second panel PA2, the bending head BH presses the first flexible printed circuit board FPC1 toward the second panel PA2 to attach the first flexible printed circuit board FPC1 and the second panel PA2 together. In an embodiment, the bending head BH presses the first flexible printed circuit board FPC1, but the present invention is not limited thereto. In another embodiment, an additional pressing member may press the first flexible printed circuit board FPC1 to attach the first flexible printed circuit board FPC1 and the second panel PA2 together.

FIG. 21 shows a first panel PA1, a first flexible printed circuit board FPC1, a second panel PA2, and a second flexible printed circuit board FPC2 in an apparatus for manufacturing a display device according to an embodiment of the present invention.

The second panel PA2 may include a display area DA in which an image is displayed and a non-display area NDA in which various signal lines are arranged to display an image in the display area DA.

In an embodiment, the display area DA may be at the first flat surface PA2_F1 of the second panel PA2 and the non-display area NDA may be at the second bending area BA2 and the second flat surface PA2_F2 of the second panel PA2. For example, the second bending area BA2 may be the non-display area NDA such that various signal lines, pad electrodes, and the like may be arranged on the second bending area BA2.

FIG. 22 is a plan view of a first panel PA1 and a first flexible printed circuit board FPC1 of a display device according to an embodiment of the present invention.

Referring to FIG. 22, the first flexible printed circuit board FPC1 may include a plurality of contact hands (e.g., contact extensions) and a body BO. FIG. 22 illustrates an embodiment in which the first flexible printed circuit board FPC1 includes a first contact hand H1, a second contact hand H2, and a third contact hand H3, but the number of contact hands is not limited thereto. For example, in another embodiment, the number of contact hands may be less than three or more than three.

In an embodiment, the first contact hand H1, the second contact hand H2, and the third contact hand H3 may extend in one direction and be spaced from (e.g., spaced apart from) each other (e.g., spaced from each other in another direction).

When the first flexible printed circuit board FPC1 includes the first contact hand H1, the second contact hand H2, and the third contact hand H3, a first contact portion BP1 of the first panel PA1 may include a first hand contact portion H1_b, a second hand contact portion H2_b, and a third hand contact portion H3_b. For example, the first contact hand H1, the second contact hand H2, and the third contact hand H3 correspond to the first hand contact portion H1_b, the second hand contact portion H2_b, and the third hand contact portion H3_b, respectively, and the first contact hand H1, the second contact hand H2, and the third contact hand H3 may be in contact with the first hand contact portion H1_b, the second hand contact portion H2_b, and the third hand contact portion H3_b, respectively.

In an embodiment, the first bending line BL1_1 and second bending line BL1_2 of the first flexible printed circuit board FPC1 may be formed across the first contact hand H1, the second contact hand H2, and the third contact hand H3. In this embodiment, an opening HO (e.g., a cut-out or hole) may be formed in the first flexible printed circuit board FPC1, and the opening HO may at least partially expose the second bending area BA2 of the second panel PA2 in a state where the first flexible printed circuit board FPC1 is bent. As described above with reference to FIG. 1, the laser measurement unit LA irradiates the second bending area BA2 of the second panel PA2 with a laser beam through the opening HO to measure the gap g between the second panel PA2 and the first flexible printed circuit board FPC1.

In an embodiment, the first contact hand H1 and the third contact hand H3 may be in contact with one side (e.g., one surface) of the first panel PA1, and the second contact hand H2 may be in contact with the other side (e.g., the other surface) of the first panel PA1. For example, one contact hand may be in contact with the opposite surface of the first panel PA1 as the adjacent contact hands.

One end of the first contact hand H1, the second contact hand H2, and the third contact hand H3 may be connected to the first panel PA1 and the other ends thereof may be connected to the body BO. In an embodiment, the first contact hand H1, the second contact hand H2, and the third contact hand H3 may be integrally formed with the body BO.

In an embodiment, the bending head BH may contact the body BO. For example, the body BO may include a connection portion CP that contacts the bending head BH.

One end of the body BO may be connected to the first contact hand H1, the second contact hand H2, and the third contact hand H3.

FIG. 23 is a plan view of a second panel PA2 and a second flexible printed circuit board FPC2 according to an embodiment of the present invention.

Referring to FIG. 23, the second panel PA2 may include a display area DA and a non-display area NDA at the outer periphery of the display area DA.

The second bending area BA2 may be formed on one side of the second panel PA2. For example, the first bending line BL2_1 and the second bending line BL2_2 may be formed on one side of the second panel PA2.

In one embodiment, a first alignment mark A1 and a second alignment mark A2 may be formed on the second panel PA2. The second alignment mark A2 may be disposed on one side of the second panel PA2. In a state where one side of the second panel PA2 is bent, the alignment measuring unit CA confirms that the first alignment mark A1 and the second alignment mark A2 are aligned or substantially aligned, thereby confirming whether or not the bending of the second panel PA2 has been correctly performed.

A second contact portion BP2 may be formed on one side of the second panel PA2. The second flexible printed circuit board FPC2 may contact the second contact portion BP2 to attach the second flexible printed circuit board FPC2 and the second panel PA2 to each other.

The second flexible printed circuit board FPC2 has a thin plate structure and may have various planar shapes. FIG. 23 illustrates an embodiment in which the second flexible printed circuit board FPC2 has a rectangular shape, but the shape of the second flexible printed circuit board FPC2 is not limited thereto.

Figure 24:
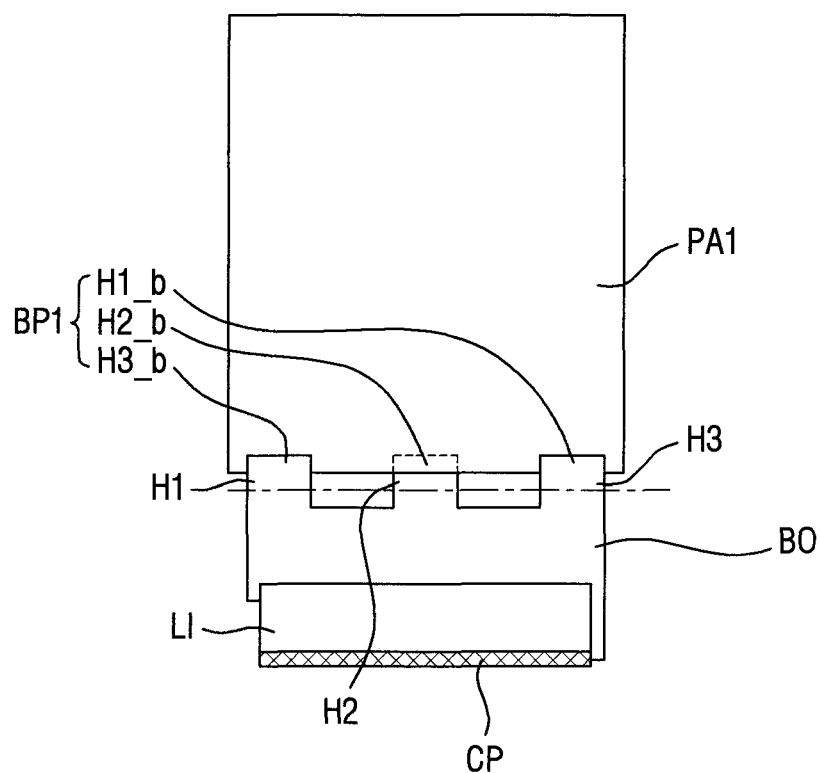
FIG. 24 is a partial plan view of a display device according to another embodiment of the present invention.
Figure 25:
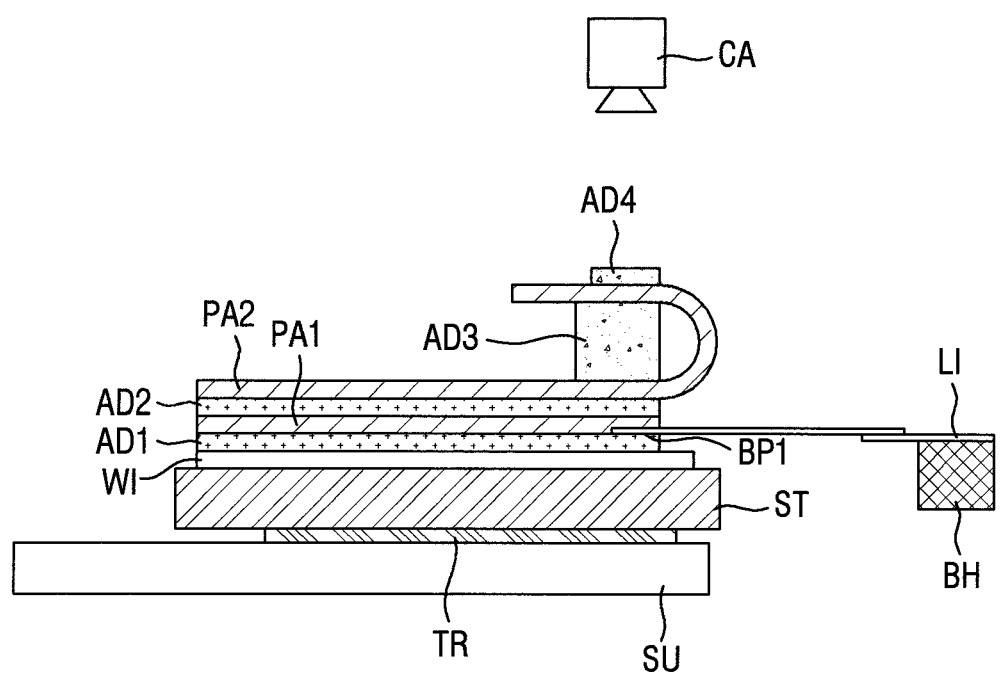
FIGS. 25 and 26 are sectional views for explaining the operation of the apparatus for manufacturing a display device according to another embodiment of the present invention.
Figure 26:
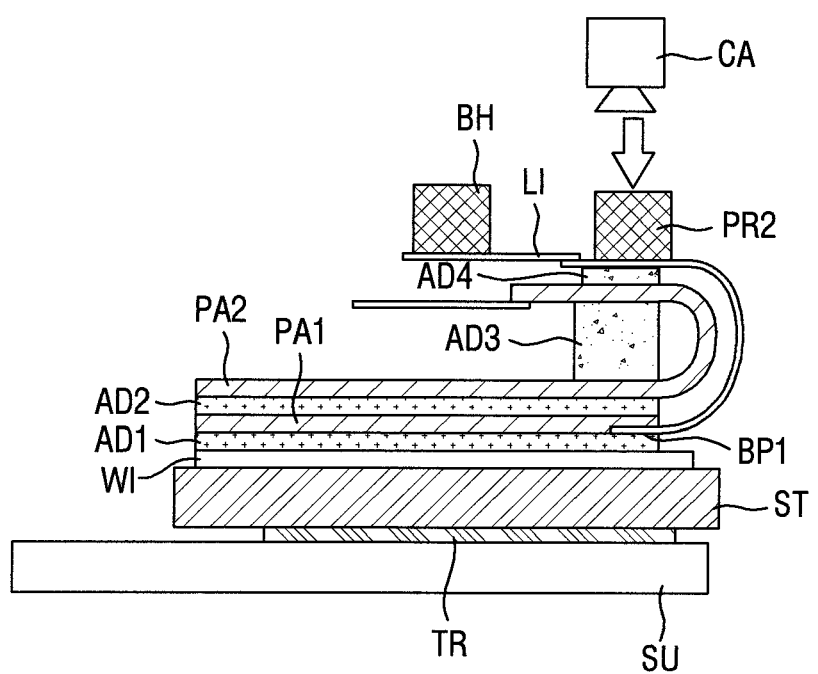

FIG. 24 is a partial plan view of a display device another embodiment of the present invention. FIGS. 25 and 26 are sectional views for explaining the operation of the apparatus for manufacturing a display device according to another embodiment of the present invention.

The display device according to the embodiment of the present invention shown in FIG. 24 is different from the embodiment of FIG. 22 in that the display device of FIG. 24 includes an auxiliary tape attached to the first flexible printed circuit board FPC1.

In an embodiment, the auxiliary tape LI may be attached to the first flexible printed circuit board FPC1. The auxiliary tape LI may be attached to the body BO of the first flexible printed circuit board FPC1. When the auxiliary tape LI is attached to the first flexible printed circuit board FPC1, the bending head BH may contact the auxiliary tape LI. For example, a connection portion at where the auxiliary tape LI is connected with the bending head BH may be formed.

When the area of the first flexible printed circuit board FPC1 available to (or configured to) contact the bending head BH is relatively small, the contact of the bending head BH with the first flexible printed circuit board FPC1 may not be stable, and thus, a failure may occur.

As described above, when the bending head BH contacts the auxiliary tape LI, sufficient contact area can be ensured, and thus, the bending operation can be performed more stably.

The operation of the apparatus for manufacturing a display device according to another embodiment of the present invention will be described with reference to FIGS. 25 and 26.

In the operation of the apparatus for manufacturing a display device according to the embodiment shown in FIGS. 25 and 26, the bending of the first flexible printed circuit board FPC1 includes attaching the auxiliary tape LI to the first flexible printed circuit board FPC1; bringing the bending head BH into contact with the auxiliary tape LI; bending the first flexible printed circuit board FPC1 such that at least a part of one side of the first flexible printed circuit board FPC1 surrounds at least a part of the second bending area BA2 of the second panel PA2 in a state where the bending head BH fixes the auxiliary tape LI; and removing the auxiliary tape LI.

Referring to FIG. 25, the auxiliary tape LI may be attached to the first flexible printed circuit board FPC1 in an initial state where no external force is applied and the bending head BH is brought into contact with the auxiliary tape LI.

Then, referring to FIG. 26, the first flexible printed circuit board FPC1 may be bent such that at least a part of one side of the first flexible printed circuit board FPC1 surrounds at least a part of the second bending area BA2 of the second panel PA2 in a state where the bending head BH fixes the auxiliary tape LI.

Then, the auxiliary tape LI may be removed. In an embodiment, the removing of the auxiliary tape LI may be performed before or after the measuring of the alignment by the alignment measurement unit CA.

In another embodiment, the auxiliary tape LI may be removed after the first flexible printed circuit board FPC1 and the second panel PA2 are attached together by pressing the first flexible printed circuit board FPC1 by using the pressing member PR2.

In an embodiment, the auxiliary tape LI may be an auxiliary tape whose adhesion is weakened by UV irradiation or whose adhesion is relatively weak in a peeling direction.

Hereinafter, a method of manufacturing a display device according to an embodiment of the present invention will be described. In the following embodiments, the same or substantially the same components as those already described are referred to with the same reference numerals and redundant descriptions thereof may be omitted or simplified.

Figure 27:
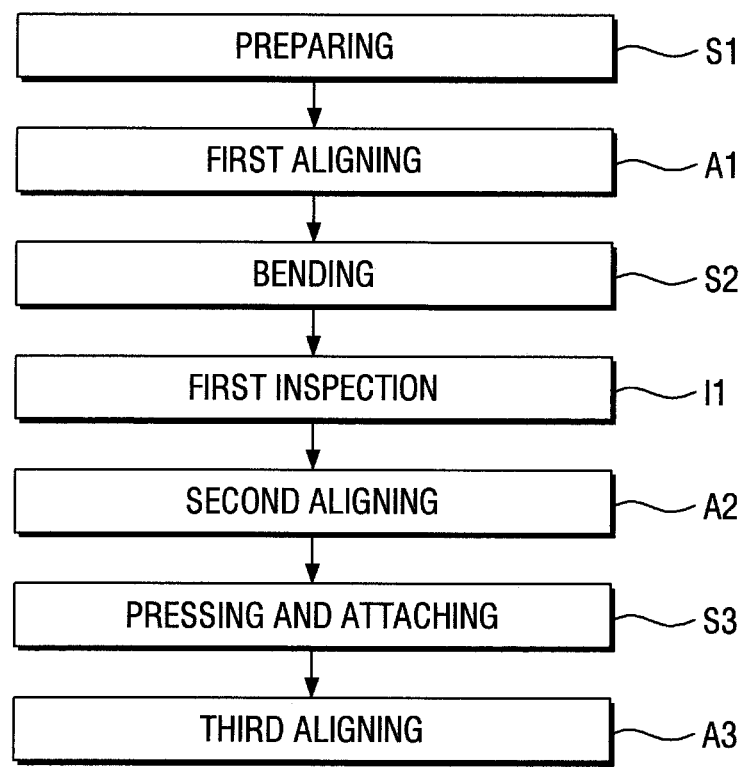
FIG. 27 is a block diagram illustrating a method of manufacturing a display device according to an embodiment of the present invention.

FIG. 27 is a block diagram illustrating a method of manufacturing a display device according to an embodiment of the present invention.

Referring to FIG. 27, a method of manufacturing a display device according to an embodiment of the present invention includes preparation S1, bending S2, and pressing and attaching S3.

The method of manufacturing a display device according to an embodiment of the present invention may be performed by using any of the above-described apparatuses for manufacturing a display device according to embodiments of the present invention. However, this method may be performed by other apparatuses as well.

For example, the method of manufacturing a display device according to an embodiment of the present invention may include all of the acts described above with respect to the above-described apparatus for manufacturing a display device according to embodiments of the present invention.

Preparation S1 may include preparing a processing object T and placing the prepared processing object T on a stage ST.

The processing object T may be the same or substantially the same as that described above with respect to the above-described apparatus for manufacturing a display device according to some embodiments. For example, the processing object T may be the same or substantially the same as that described in FIGS. 1 and 20. After the processing object T is placed on the stage ST to fix the processing object T, the bending S2 may be performed.

Figure 3:
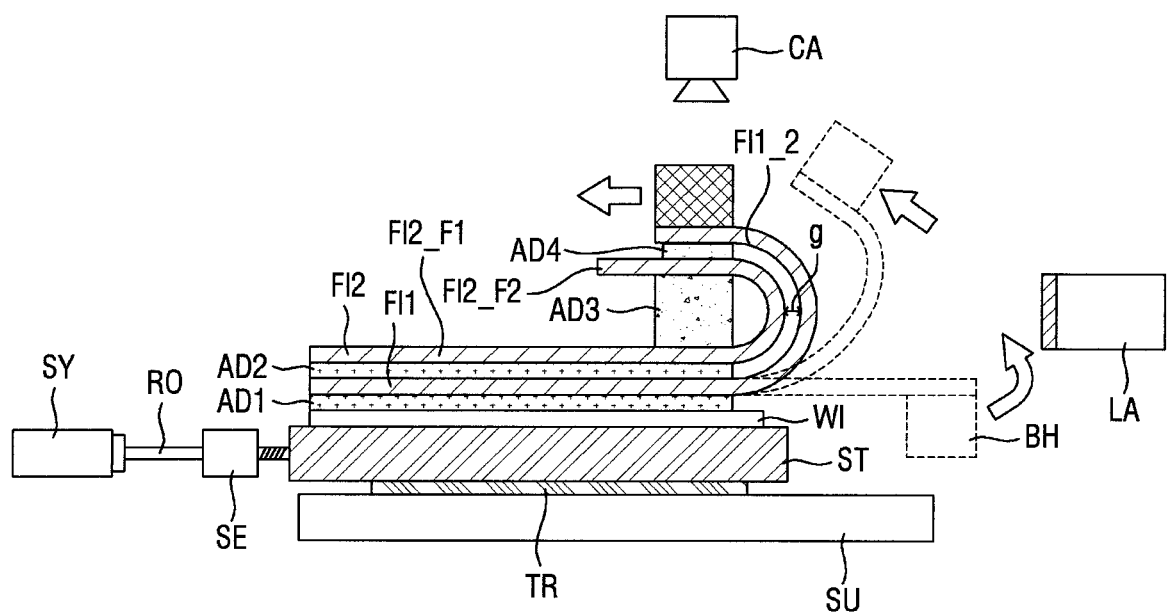
FIGS. 3-6 are views for explaining the operation of the apparatus for manufacturing a display device according to the embodiment of FIG. 1.

In an embodiment, the bending S2 may include bringing the bending head BH into contact with the first surface FI1_1 of the first film member FI1 and bending the first film member FI1 such that at least a part of one side of the first film member FI1 surrounds at least a part of the bending area BA2 of the second film member FI2 in the state where the bending head BH fixes the first film member FI1 (refer to, for example, FIGS. 2 and 3).

In this embodiment, the first film member FI1 may be spaced from (e.g., spaced apart from) the second film member FI2 (refer to, for example, FIG. 3) or may be at least partially in contact with the second film member FI2 (refer to, for example, FIG. 4).

When the first film member FI1 is at least partially in contact with the second film member FI2, the bending S2 may include measuring the force applied to the stage ST and/or pushing the rod RO toward the cylinder SY to move the stage ST.

In another embodiment, the bending S2 may include moving the stage ST downward by rotating the stage ST (refer to, for example, FIG. 7).

In another embodiment, the bending S2 may include bending the first film member FI1 such that at least a part of one side of the first film member FI1 surrounds at least a part of the bending area BA2 of the second film member FI2 in the state where the first finger FI1 and second finger FI2 of the bending head BH fixes the first film member FI1 and bringing the pressing member PR into contact with the first film member FI1 and detaching the bending head BH1 from the first film member (refer to, for example, FIG. 8).

In another embodiment, the bending S2 may include bending the first film member FI1 such that the angle formed by the extension line EL of the first film member FI1 and the virtual horizontal line HL is a right angle (e.g., a first bending step); bringing the bending guide BG into contact with the first film member FI1 in a state where the angle formed by the extension line EL of the first film member FI1 and the virtual horizontal line HL is a right angle; and allowing the bending head BH to bend the first film member FI1 in a state where the bending guide BG is in contact with the first film member FI1 (e.g., a second bending step) (refer to, for example, FIGS. 10 and 11).

In another embodiment, the bending S2 may include bending the first film member FI1 such that the angle formed by the extension line EL of the first film member FI1 and the virtual horizontal line HL is a right angle in a state where the front bending head BH_f is in contact with the second surface FI1_2 of the first film member FI1 (e.g., a first bending step); detaching the front bending head BH_f from the first film member FI1 and bringing the back bending head BH_b into contact with the first surface FI1_1 of the first film member FI1 in a state where the angle formed by the extension line EL of the first film member FI1 and the virtual horizontal line HL is a right angle; and bending the first film member FI1 in a state where the back bending head BH_b is in contact with the first surface FI1_1 of the first film member FI1 (e.g., a second bending step) (refer to, for example, FIGS. 12-14).

In another embodiment, the bending S2 may include bringing the bending head BH into contact with the first film member FI1 when the first film member FI1 is pulled down (e.g., is pulled down by gravity) (refer to, for example, ① of FIG. 15) and bending the first film member FI1 such that at least a part of one side of the first film member FI1 surrounds at least a part of the bending area BA2 of the second film member FI2 in the state where the bending head BH fixes the first film member FI1 (refer to, for example, ② of FIG. 16).

In another embodiment, the processing object T may be configured such that the first film member FI1 includes a first panel PA1 and a first flexible printed circuit board FPC1 and the second film member FI2 includes a second panel PA2 and a second flexible printed circuit board FPC2.

For example, in another embodiment, the bending S2 may include bringing the bending head BH into contact with the first flexible printed circuit board FPC1 and bending the first flexible printed circuit board FPC1 such that at least a part of one side of the first flexible printed circuit board FPC1 surrounds at least a part of the bending area BA2 of the second panel PA2 in a state where the bending head BH fixes the first flexible printed circuit board FPC1 (refer to, for example, FIG. 20).

In another embodiment, the first flexible printed circuit board FPC1 may include a plurality of contact hands, and the bending head BH may be in contact with a connection portion CP of a body BO of the first flexible printed circuit board FPC1 (refer to, for example, FIG. 22).

In another embodiment, the bending S2 may include attaching an auxiliary tape LI to the first flexible printed circuit board FPC1; bringing the bending head BH into contact with the auxiliary tape LI; bending the first flexible printed circuit board FPC1 such that at least a part of one side of the first flexible printed circuit board FPC1 surrounds at least a part of the second bending area BA2 of the second panel PA2 in a state where the bending head BH fixes the auxiliary tape LI; and removing the auxiliary tape LI.

After the bending S2, the pressing and attaching S3 may be performed. The pressing and attaching S3 may include allowing the bending head BH to press the first film member FI1 toward the second film member FI2 to attach the first film member FI1 and the second film member FI together. While an embodiment in which the bending head BH presses the first film member FI1 has been exemplified, the present invention is not limited thereto. In another embodiment, an additional pressing member may press the first film member FI1 to attach the first film member FI1 and the second film member FI2 together.

Further, in another embodiment, the first film member FI1 and the second film member FI2 may instead be a first flexible printed circuit board FPC1 and a second panel PA2, respectively.

The pressing and attaching S3 may be performed once but, in other embodiments, may be performed two times or more. For example, prepressing may be performed first (e.g., a first pressing and attaching step), and pressing and attaching S3 may be performed after adjusting and checking the alignment of the first film member FI1 and the second film member FI2.

A method of manufacturing a display device according to an embodiment of the present invention may include a plurality of aligning steps.

For example, a method of manufacturing a display device according to an embodiment of the present invention may include a first aligning A1, a second aligning A2, and a third aligning A3. However, this is illustrative, and the number of aligning steps is not limited to three. In other embodiments, some of the above-described aligning steps may be omitted. The aligning may be performed by an alignment measurement unit CA according to some embodiments of the present invention, but the present invention is not limited thereto.

The first aligning A1 may be performed between the preparing S1 and the bending S2. The first aligning A1 may include checking and adjusting the alignment of the processing object T and the stage ST. For example, the first aligning A1 may include adjusting the alignment of the processing object T and the stage ST.

The second aligning A2 may be performed between the bending S2 and the pressing and attaching S3. The second aligning A2 may include checking and adjusting the alignment of the first film member FI1 and the second film member FI2 or the alignment of the first flexible printed circuit board FPC1 and the second panel PA2.

The third aligning A3 may be performed after the pressing and attaching S3. The third aligning A3 may include checking the final alignment in the attached state. In an exemplary embodiment in which the pressing and attaching S3 includes the first pressing and attaching and the second pressing and attaching, the third aligning A3 may be performed between the first pressing and attaching and the second pressing and attaching.

A method of manufacturing a display device according to an embodiment of the present invention may include a first inspection I1.

The first inspection I1 may be performed by the laser measurement unit LA. The first inspection I1 may include measuring the gap between the first film member FI1 and the second film member FI2 by irradiating the first film member FI1 and/or the second film member FI2 with a laser.

In another embodiment, the first inspection I1 may be performed between the bending S2 and the pressing and attaching S3. However, the present invention is not limited thereto, and in another embodiment, the first inspection I1 may be performed intermittently or continuously during the bending S2. Further, in an exemplary embodiment in which the pressing and attaching S3 includes the first pressing and attaching and the second pressing and attaching, the first inspection I1 may be performed between the first pressing and attaching and the second pressing and attaching.

Figure 28:
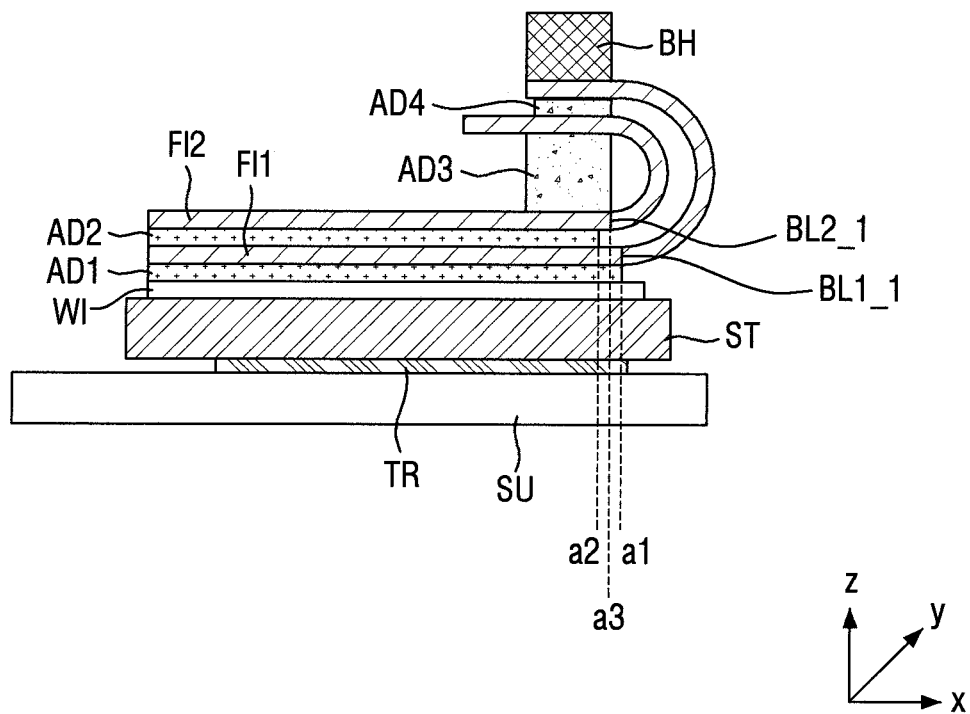
FIG. 28 is a sectional view for explaining a method of manufacturing a display device according to another embodiment of the present invention.

FIG. 28 is a sectional view for explaining a method of manufacturing a display device according to another embodiment of the present invention.

In the method of manufacturing a display device according to the embodiment of the present invention shown in FIG. 28, the preparing the processing object may include forming (or providing) a first adhesive layer AD1; forming (or placing) a first film member FI1 on the first adhesive layer AD1; forming (or placing) a second adhesive layer AD2 on the first film member FI1; and forming (or placing) a second film member FI2 on the second adhesive layer AD2. In some embodiments, an end of the first adhesive layer AD1 may be at an outer side relative to the end of the second adhesive layer AD2 (e.g., the first adhesive layer AD1 may be longer than the second adhesive layer AD2).

The position of the first bending line BL1_1 of the first film member FI1 may be changed or adjusted depending on the positions of the ends of the first adhesive layer AD1 and the second adhesive layer AD2 disposed on and/or beneath the first film member FI1.

For example, as shown in FIG. 28, when the end a1 of the first adhesive layer AD1 is formed at the outer side relative to (e.g., beyond) the end a2 of the second adhesive layer AD2, the first bending line BL1_1 may be shifted in the +x-axis direction compared to an embodiment in which the ends of the first adhesive layer AD1 and the second adhesive layer AD2 are aligned with each other. For example, in the embodiment of FIG. 28, the first bending line BL1_1 may be outside (or beyond) the end a1 of the first adhesive layer AD1. Because the end a1 of the first adhesive layer AD1 may pull down on the first film member FI1, the first bending line BL1_1 being outside the end a1 of the first adhesive layer AD1 may suppress the bending of the first film member FI1.

When the first bending line BL1_1 is shifted in the +x-axis direction, the gap g between the first film member FI1 and the second bending area BA2 of the second film member FI2 may be stably maintained. Thus, contact between the first film member FI1 and the second bending area BA2 of the second film member FI2 may be suppressed (e.g., avoided or substantially avoided) during the bending.

In some embodiments, an end a3 of the third adhesive layer AD3 may be disposed between the end a1 of the first adhesive layer AD1 and the end a2 of the second adhesive layer AD2. When the end a3 of the third adhesive layer AD3 is disposed outside the end a1 of the first adhesive layer AD1, the end a3 of the third adhesive layer AD3 may be disposed inside (e.g., before) the end a1 of the first adhesive layer AD1 because the first bending line BL2_1 of the second film member FI2 may be shifted in the +x-axis direction.

Explaining again from the viewpoint of the bending line, when the adhesive layer has the structure shown in FIG. 28, the first bending line BL1_1 of the first film member FI1 may be aligned with or disposed outside the end a1 of the first adhesive layer AD1.

For example, the first bending line BL1_1 of the first film member FI1 and the second bending line BL1_2 of the first film member FI1 may be aligned with each other, or the first bending line BL1_1 of the first film member FI1 may be disposed at the outer side relative to the first bending line BL2_1 of the second film member FI2.

Figure 29:
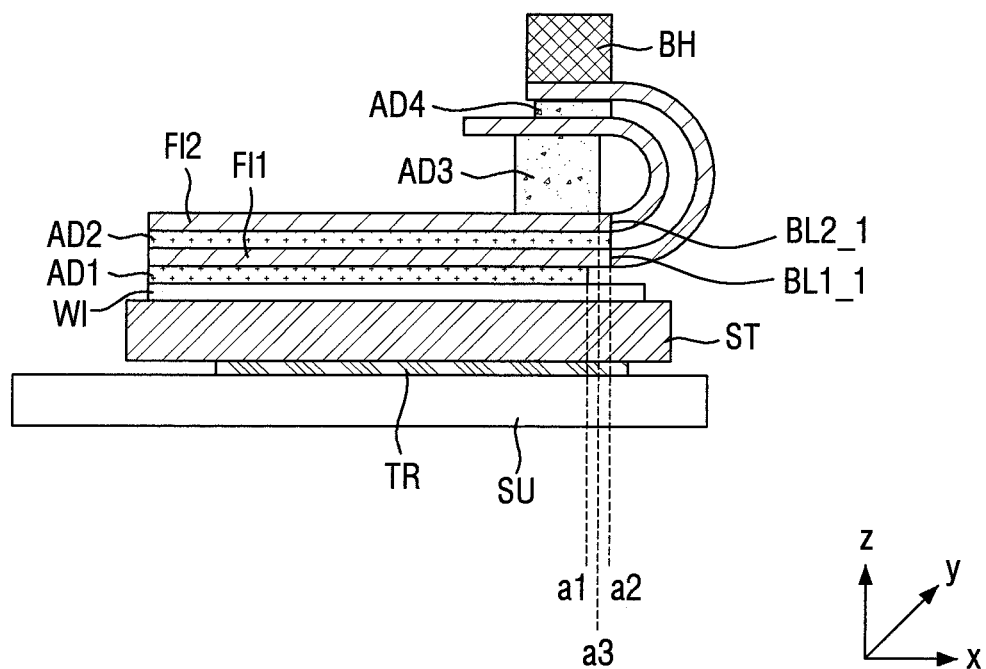
FIG. 29 is a sectional view for explaining a method of manufacturing a display device according to another embodiment of the present invention.

FIG. 29 is a sectional view for explaining a method of manufacturing a display device according to another embodiment of the present invention.

In the method of manufacturing a display device according to another embodiment of the present invention shown in FIG. 29, the preparing the processing object may include forming (or providing) a first adhesive layer AD1; forming (or placing) a first film member FI1 on the first adhesive layer AD1; forming (or placing) a second adhesive layer AD2 on the first film member FI1; and forming (or placing) a second film member FI2 on the second adhesive layer AD2. In some embodiments, the end of the second adhesive layer AD2 may be at the outer side relative to the end of the first adhesive layer AD1.

The position of the first bending line BL1_1 of the first film member FI1 may be changed or adjusted depending on the positions of the ends of the first adhesive layer AD1 and the second adhesive layer AD2 disposed on and/or beneath the first film member FI1.

For example, as shown in FIG. 29, when the end a2 of the second adhesive layer AD2 is at the outer side relative to the end a1 of the first adhesive layer AD1, the first bending line BL1_1 may be shifted in the +x-axis direction compared to when the ends of the first adhesive layer AD1 and the second adhesive layer AD2 are aligned with each other. In this case, the first bending line BL1_1 may be aligned with the end a2 of the second adhesive layer AD2, or may be disposed outside the end a2 of the second adhesive layer AD2. Because the end a2 of the second adhesive layer AD2 may pull down on the first film member FI1, the above-described configurations of the ends of the first and second adhesive layers AD1 and AD2 may suppress the bending of the first film member FI1.

When the first bending line BL1_1 is shifted in the +x-axis direction, the gap g between the first film member FI1 and the second bending area BA2 of the second film member FI2 may be stably maintained. Thus, contact between the first film member FI1 and the second bending area BA2 of the second film member FI2 may be suppressed (e.g., avoided or substantially avoided) during the bending.

In some embodiments, the end a3 of the third adhesive layer AD3 may be disposed between the end a1 of the first adhesive layer AD1 and the end a2 of the second adhesive layer AD2. When the end a3 of the third adhesive layer AD3 is disposed outside the end a2 of the second adhesive layer AD2, the end a3 of the third adhesive layer AD3 may be disposed inside the end a2 of the second adhesive layer AD2 because the first bending line BL2_1 of the second film member FI2 may be shifted in the +x-axis direction.

Explaining again from the viewpoint of the bending line, when the adhesive layer has the structure shown in FIG. 29, the first bending line BL1_1 of the first film member FI1 may be aligned with or disposed outside the end a2 of the second adhesive layer AD2.

For example, the first bending line BL1_1 of the first film member FI1 and the first bending line BL2_1 of the second film member FI2 may be aligned with each other, or the first bending line BL1_1 of the first film member FI1 may be disposed at the outer side relative to the first bending line BL2_1 of the second film member FI2.

Figure 30:
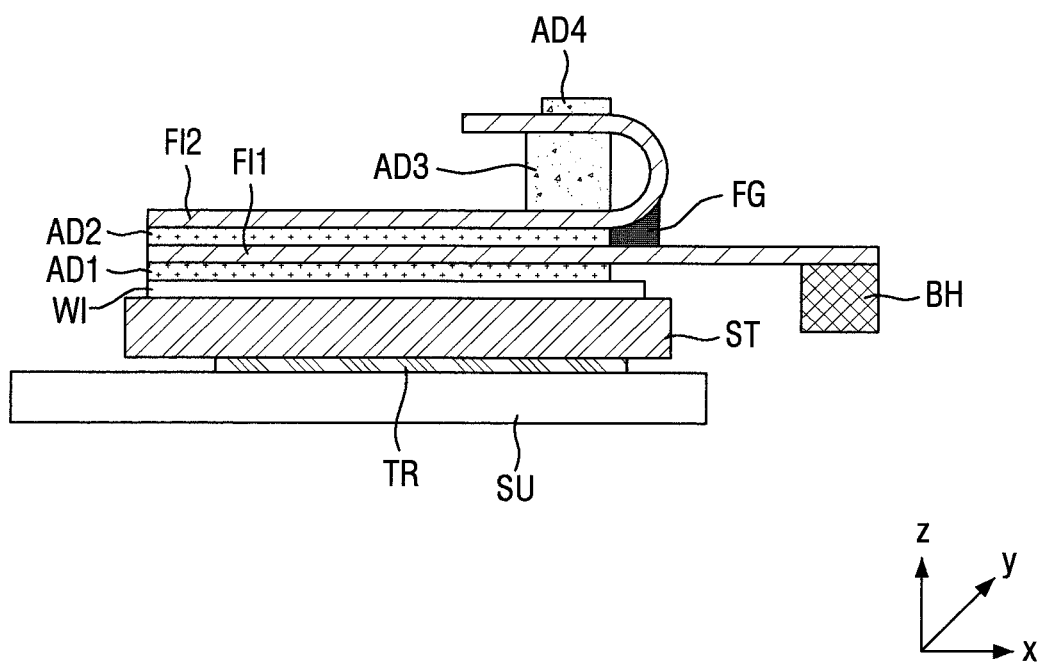
FIGS. 30-32 are sectional views for explaining a method of manufacturing a display device according to another embodiment of the present invention.
Figure 31:
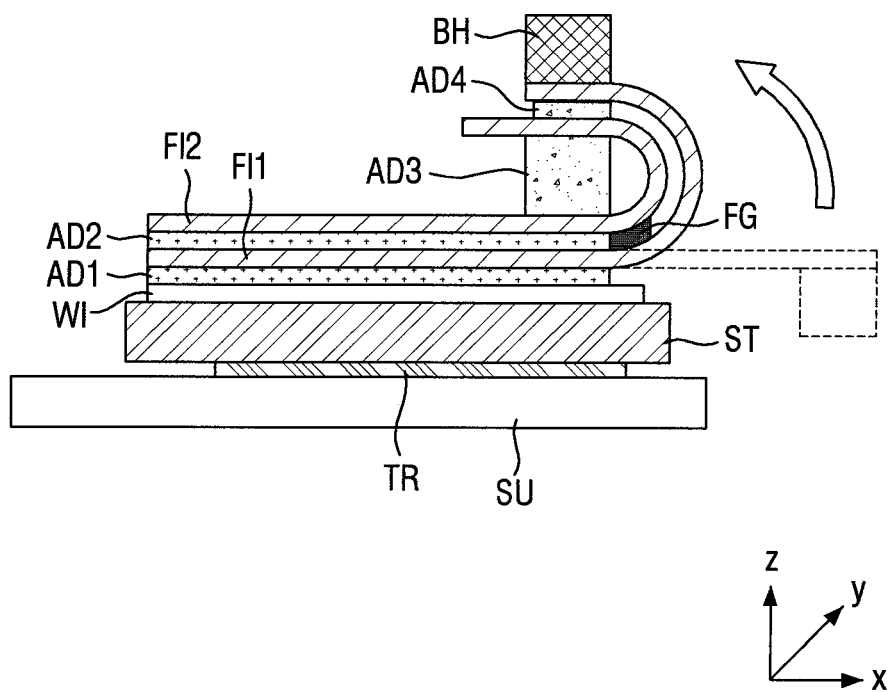
Figure 32:
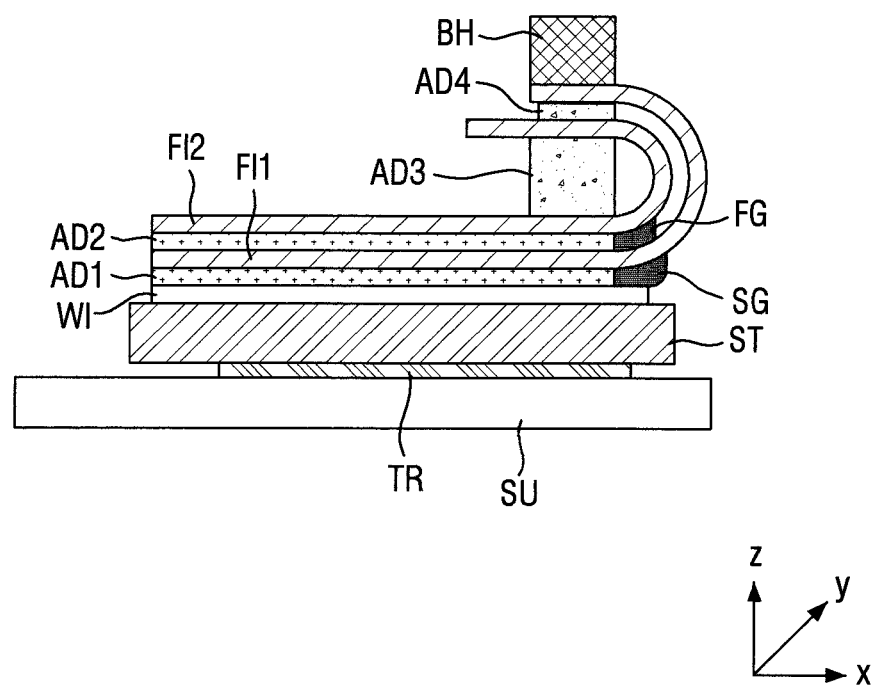

FIGS. 30-32 are sectional views for explaining a method of manufacturing a display device according to another embodiment of the present invention. In the method of manufacturing a display device according to the embodiment of the present invention shown in FIGS. 30-32, the preparation S1 may include injecting (or inserting) a first support FG between the first film member FI1 and the second film member FI2. The first support FG may be disposed to be in contact with the end of the second adhesive layer AD2. In an embodiment, the first support FG may be a gel-type support. The gel-type support FG may be disposed between the first film member FI1 and the second bending area BA2 of the second film member by using a capillary phenomenon or the like. However, this is illustrative, and the method of disposing the first support FG is not limited thereto.

Next, referring to FIG. 31, bending the first film member FI1 may be performed in a state where the support FG is interposed therebetween. The first bending line BL1_1 of the first film member FI1 may be shifted by the support FG interposed between the first film member FI1 and the second bending region BA2 of the second film member, or the bending curvature of the first film member FI1 adjacent to the support FG may be reduced by the support FG. Thus, the gap g between the first film member FI1 and the second bending area BA2 of the second film member FI2 can be stably maintained. As a result, contact between the first film member FI1 and the second film member FI2 can be suppressed.

Next, referring to FIG. 32, a second support SG may be disposed between the first film member FI1 and the window WI after the bending S2 or after the pressing and attaching S3.

The second support member SG may serve to fix the bending state of the first film member FI1 or to maintain the bent shape of the first film member FI1.

Accordingly, it is possible to suppress movement of the first film member FI1, and the first film member FI1 may prevented from contacting the second film member FI2 during the process or after the process, thereby avoiding defects. As described above, according to embodiments of the present invention, components may not be damaged during the bending process and durability of a component including a bending area may be improved.

However, the present invention provides other features than those discussed above.

Although exemplary embodiments of the present invention have been disclosed herein for illustrative purposes, those skilled in the art will appreciate that various modifications, additions, and/or substitutions are possible without departing from the scope and spirit of the present invention as disclosed in the accompanying claims and their equivalents. The exemplary embodiments described herein should be considered in a descriptive sense only and not for purposes of limitation.

What is claimed is:

1. A method of manufacturing a display device, the method comprising:

placing a processing object on a stage, the processing object comprising a first film member and a second film member, the first and second film members being partially adhered to each other by a first adhesive layer; and bending the first film member of the processing object such that a part of one side of the first film member surrounds a part of an outer side of a bending area of a second film member of the processing object and the first and second film members are further adhered to each other by a second adhesive layer, the first and second adhesive layers being spaced apart from each other on opposite sides of a bent portion of the first and second film members, wherein an empty gap is formed between the bent portion of the first film member and the bent portion of the second film member along an entire distance between the first adhesive layer and the second adhesive layer, wherein the first film member comprises a first flexible printed circuit board, and wherein the second film member comprises a display panel.

2. The method of claim 1, further comprising measuring a force applied to the stage.

3. The method of claim 1, wherein the bending comprises:

bringing a bending head into contact with the first film member; and bending the first film member to surround the part of the outer side of the bending area of the second film member while the bending head is fixed to the first film member.

4. The method of claim 1, wherein the bending comprises:

bending the first film member to surround the part of the outer side of the bending area of the second film member while a bending head is fixed to the first film member; and bringing a pressing member into contact with the first film member and detaching the bending head from the first film member, and wherein the bending head comprises a first finger and a second finger.

5. The method of claim 1, wherein the bending comprises:

bending the first film member such that an angle formed by an extension line of the first film member and a virtual horizontal line is a right angle while a front bending head is in contact with the one side of the first film member;

detaching the front bending head from the first film member and bringing a back bending head into contact with another side of the first film member; and bending the first film member while the back bending head is fixed to the first film member.

6. The method of claim 1, wherein the first film member further comprises a first panel connected with the first flexible printed circuit board, and wherein the second film member further comprises a second flexible printed circuit board connected with the display panel.

7. The method of claim 6, wherein the display panel has the bending area, and
wherein the bending comprises bending the first flexible printed circuit board such that the part of the one side of the first flexible printed circuit board surrounds the part of the outer side of the bending area of the display panel while a bending head is fixed to the first flexible printed circuit board.

8. The method of claim 7, wherein the bending comprises:
attaching an auxiliary tape to the first flexible printed circuit board; and
bending the first flexible printed circuit board such that the part of the one side of the first flexible printed circuit board surrounds the part of the outer side of the bending area of the display panel while the bending head is in contact with the first flexible printed circuit board.

9. The method of claim 6, wherein the first flexible printed circuit board comprises a plurality of contact hands, and each of the contact hands is connected with the first panel.

10. The method of claim 9, wherein the processing object further comprises a third adhesive layer, and
wherein the third adhesive layer, the first film member, the first adhesive layer, and the second film member are sequentially laminated.

11. The method of claim 10, wherein an end of the third adhesive layer is outside of an end of the first adhesive layer.

12. The method of claim 10, wherein an end of the first adhesive layer is outside of an end of the third adhesive layer.

13. The method of claim 10, further comprising arranging a first support between the first film member and the bending area of the second film member.

14. The method of claim 13, further comprising arranging a second support to maintain the bent shape of the first film member after the bending.

15. The method of claim 1, wherein a plurality of electronic elements are on the first film member.

16. The method of claim 1, further comprising measuring a gap between the first film member and the second film member after the bending, the gap being at the bent portion between the first and second adhesive layers.

17. The method of claim 1, further comprising checking an alignment of the first film member and the second film member.

18. A method of manufacturing a display device, the method comprising:
placing a processing object on a stage; and
bending a first film member of the processing object such that a part of one side of the first film member surrounds a part of an outer side of a bending area of a second film member of the processing object, the first and second film members of the processing object being laminated on each other,
wherein a cylinder is at one side of the stage and a rod extends between the cylinder and the stage, and
wherein the rod moves into the cylinder to induce movement of the stage when the first film member contacts with the second film member during the bending.

19. A method of manufacturing a display device, the method comprising:
placing a processing object on a stage; and
bending a first film member of the processing object such that a part of one side of the first film member surrounds a part of an outer side of a bending area of a second film member of the processing object, the first and second film members of the processing object being laminated on each other,
wherein the bending comprises lowering one end of the stage by pivoting the stage.

20. A method of manufacturing a display device, the method comprising:
bending a first film member of a processing object such that a part of one side of the first film member surrounds a part of an outer side of a bending area of a second film member of the processing object, the first and second film members of the processing object being laminated on each other,
wherein the bending comprises:
bending the first film member such that an angle formed by an extension line of the first film member and a virtual horizontal line is a right angle;
bringing a bending guide into contact with the first film member; and
allowing a bending head to bend the first film member while the bending guide is in contact with the first film member.

* * * * *